(12) United States Patent
Wang et al.

(10) Patent No.: US 8,089,801 B2
(45) Date of Patent: Jan. 3, 2012

(54) SEMICONDUCTOR MEMORY DEVICE AND METHOD OF FORMING THE SAME

(75) Inventors: Peng-Fei Wang, Shanghai (CN); Yi Gong, Changshu (CN)

(73) Assignee: Suzhou Oriental Semiconductor Co., Ltd., Suzhou (CN)

( * ) Notice: Subject to any disclaimer, the term of this patent is extended or adjusted under 35 U.S.C. 154(b) by 711 days.

(21) Appl. No.: 12/285,619

(22) Filed: Oct. 9, 2008

(65) Prior Publication Data

US 2009/0185426 A1 Jul. 23, 2009

(30) Foreign Application Priority Data

Jan. 23, 2008 (CN) .......................... 2008 1 0043070

(51) Int. Cl.
*G11C 11/24* (2006.01)
(52) U.S. Cl. ... 365/149; 257/261; 365/175; 365/185.18; 365/243
(58) Field of Classification Search .................. 257/261; 365/149, 175, 185.18, 243
See application file for complete search history.

(56) References Cited

U.S. PATENT DOCUMENTS

| | | | |
|---|---|---|---|
| 6,538,916 B2* | 3/2003 | Ohsawa | 365/149 |
| 6,617,651 B2* | 9/2003 | Ohsawa | 257/366 |
| 6,897,515 B2* | 5/2005 | Fujiwara | 257/315 |
| 7,106,620 B2 | 9/2006 | Chang et al. | |
| 2006/0279985 A1 | 12/2006 | Keshavarzi et al. | |

FOREIGN PATENT DOCUMENTS

| | | | |
|---|---|---|---|
| JP | 07106444 A | * | 4/1995 |
| JP | 2002-246571 A | | 8/2002 |
| JP | 2003-031693 A | | 1/2003 |

OTHER PUBLICATIONS

Wang et al., "A Novel Self-Refreshable Capacitorless DRAM Cell," Sep. 2009, Solid State Device Research Conference, 2009. ESSDERC '09. Proceedings of the European, pp. 113-116.*
Wang et al., "Design of a Novel Capacitorlewss DRAM Cell with Enhanced Retension Performance," Apr. 2009, Microelectronics and Electron Devices, 2009. WMED 2009. IEEE Workshop on, pp. 1-4.*
Wang et al., "A Novel 4.5F2 Capacitorless Semiconductor Memory Device," Oct. 2008, Electron Device Letters, IEEE, vol. 29, No. 12, pp. 1347-1348.*
Machine translation (in English) of JP 7106444A retrieved from PAJ retrieved by Examiner.*
"Floating Body RAM Technology and its Scalability to 32nm Node and Beyond", T. Shino et al., 1-4244-0439-8/06 2006 IEEE, 4 pages.
"Memory Design Using a One-Transistor Gain Cell on SOI", T. Ohsawa et al., IEEE Journal of Solid-State Circuits, vol. 37, No. 11, Nov. 2002, pp. 1510-1522.

* cited by examiner

*Primary Examiner* — Alexander Sofocleous
(74) *Attorney, Agent, or Firm* — Birch, Stewart, Kolasch & Birch, LLP

(57) ABSTRACT

The present invention discloses a semiconductor memory device comprising a source, a drain, a floating gate, a control gate, a recess channel and a gated p-n diode. The said p-n diode connects said floating gate and said drain. The said floating gate is for charge storage purpose, it can be electrically charged or discharged by current flowing through the gated p-n diode. An array of memory cells formed by the disclosed semiconductor memory device is proposed. Furthermore, an operating method and a method for producing the disclosed semiconductor memory device and array are described.

16 Claims, 22 Drawing Sheets

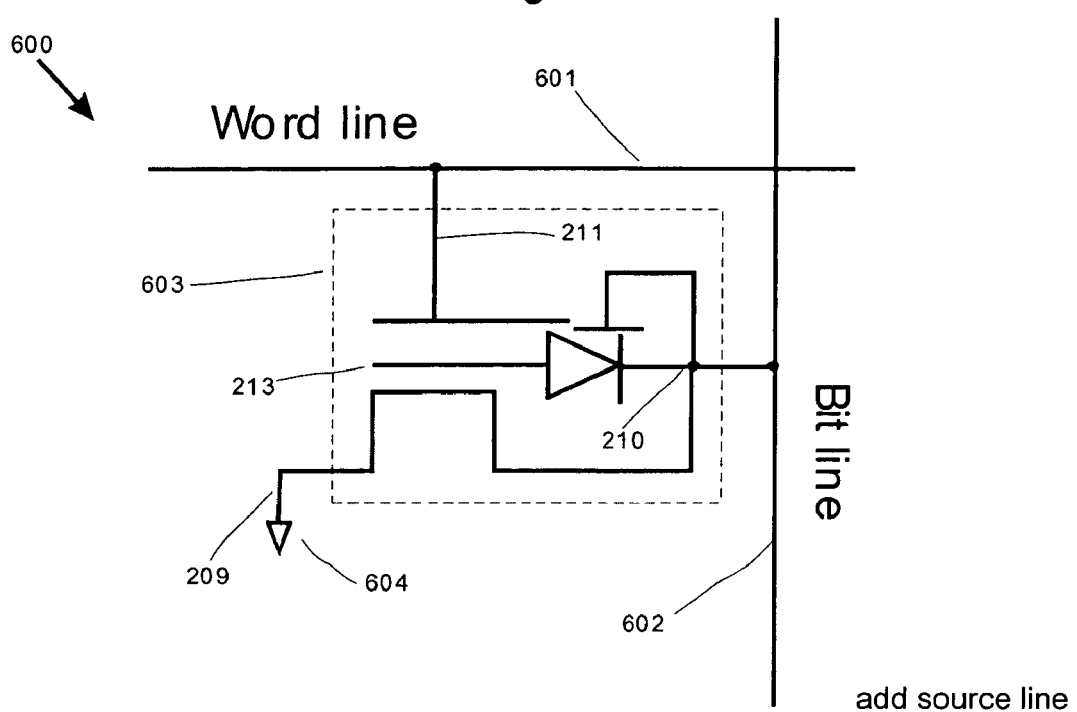

Fig. 7.

|  | WL voltage / V | BL voltage / V | SL voltage / V |
|---|---|---|---|
| Write "1" | -2.8 | 1.8 | 0 |
| Write "0" | 2.5 | 0 | 0 |
| Read | 2.5 | 1 | 0 |
| Stand-by | 0 | 0.5 | 0 |

SEMICONDUCTOR MEMORY DEVICE AND METHOD OF FORMING THE SAME

BACKGROUND OF THE INVENTION

Semiconductor memory devices are widely used in many electronic products. Depending on the field of application, memory cell types having different operating speed and density are desired. For example, static random access memory (SRAM) is optimized for high random access speed, while stand alone dynamic random access memory (DRAM) is optimized for high density but moderate random access speed.

FIG. 5a-c illustrate semiconductor memory cells of prior arts. 1T-1C DRAM cell is shown in FIG. 5a; floating body cell (1T-DRAM) is shown in FIG. 5b; 6T-SRAM cell is shown in FIG. 5c.

A conventional 1T-1C DRAM cell 500 consists of 1 access transistor 503 and 1 capacitor 504. When operating a 1T-1C DRAM cell, a logic bit can be assigned to a cell, wherein a first logic state of the bit can be assigned to the state with high potential and a second logic state of the bit can be assigned to the memory cell with lower potential. When reading a 1T-1C memory cell, the access transistor 503 is turned on by word line 501. The bit-line voltage will be affected due to charge sharing between the storage capacitor 504 and the bit line 502. Using a voltage sense amplifier, the voltage change of bit line can be sensed and logic state of the DRAM memory cell can be distinguished. DRAM read operation is destructive and a write-back sequence is needed to restore the read bits. Therefore, the random access speed of DRAM is usually lower than 6-T SRAM 520 which does not need the write-back sequence after read operation. In addition, the capacitance of the storage capacitor must not be too low in order to store sufficient charge. Thus, the area of capacitor is difficult to be scaled and the processes for building capacitor add to DRAM manufacturing complexity.

An example 6-transistor (6T) SRAM is shown in FIG. 5c. The cross-coupled inverters are used to store logic state "1" or "0". Two access NMOS-FETs are used to access the storage nodes. The read operation of SRAM cell is non-destructive. Furthermore, SRAM can have very short time for write and read, e.g. 0.5 nano-second. For these reasons, SRAM is applied in Central Processing Unit (CPU) as L1 and L2 caches. The conventional SRAM cell is formed by 6 transistors, thus it has larger unit cell size compared to DRAM cell which usually has 1 access transistor and 1 capacitor (1T-1C). With the scaling of SRAM, the standby leakage current increases, resulting in an increasing power consumption. In addition, as the circuit scaled, the static noise margin window of 6-T SRAM gets smaller and the stability gets worse. In order to improve the static noise margin and stability, an 8-transistor SRAM cell was proposed by L. Chang, et al. [U.S. patent application: U.S. Pat. No. 7,106,620, B2]. The trade-off of improved stability is increased transistor numbers and therefore larger unit memory cell size.

In order to combine the advantages of SRAM and DRAM into a single memory cell, recently, floating body cell (FBC) memory was proposed by T. Ohsawa[1]. [Takashi Ohsawa et al., "Memory Design Using One-Transistor Gain Cell on SOI", ISSCC Digest of Technical Papers, 2002, pp. 152-153]. FIG. 5b shows an equivalent circuit for a FBC[2] [U.S. patent application: US 2006/0279985 A1, A. Keshavarzi, et. al.]. This kind of memory cell is formed by a single MOSFET which is usually fabricated on silicon-on-insulator (SOI) substrate. By storing the majority charges in the floating body, the threshold voltage of a MOSFET can be changed. Memory cells with high or low threshold voltage are assigned to logic bit 1 or 0. When reading a cell, a certain voltage is applied and current will flow through the FBC memory cell. Using a sensing circuitry, for example, a current sensor, logic state stored in one FBC (e.g. 0 or 1) can be distinguished.

Compared to the conventional 1T-1C DRAM and 6-T SRAM, the 1T configuration of FBC memory has smaller unit cell size. For FBC, the read operation is quasi non-destructive and the write-back sequence after reading-operation is not mandatory. Therefore, its random access speed can be faster than DRAM and close to SRAM. FBC has potential to become the replacement of SRAM and DRAM in the future. However, FBC usually requires SOI substrate which is usually more expensive than the conventional bulk silicon substrate. In addition, only very limited number of charges are stored in the floating body, as results in poor retention performance. Further, the performance of FBC is quite sensitive to temperature. For instance, the writing speed will be lower and the stored charge will vanish faster at higher operating temperature. There are some methods existing to improve the performance of this kind of memory cell, e.g. an back-bias gate electrode was proposed in addition to the main control gate[3]. [Published Japanese Patent Application No. 2002-246571 and 2003-31693.] However, the junction leakage current in FBC is hard to be scaled when scaling down the FBC cell, the retention performance of FBC is usually much worse than 1T-1C DRAM even with back-gate bias[4]. [IEDM tech. Dig. 2006: Floating Body RAM Technology and its Scalability to 32 nm Node and Beyond, T. Shino. Page: 1-4]

Among the above mentioned three types of semiconductor memory devices, SRAM has the highest speed but the unit cell size is the largest. 1T-1C DRAM has moderate unit cell size and speed. FBC has the smallest unit cell size and simplest structure but the data retention performance is poor. The present invention proposes a different type of semiconductor memory cell which has the advantages of high retention performance, small cell size, and high random access speed.

BRIEF DESCRIPTION OF THE SEVERAL VIEWS OF THE DRAWINGS

FIG. 6 illustrates an example memory cell formed by floating junction gate semiconductor device, according to one embodiment of the present invention.

FIG. 7 illustrates example voltage settings for FJG memory cell at read, write, and stand-by operations, according to one embodiment.

DETAILED DESCRIPTION OF THE INVENTION

Figure 1:
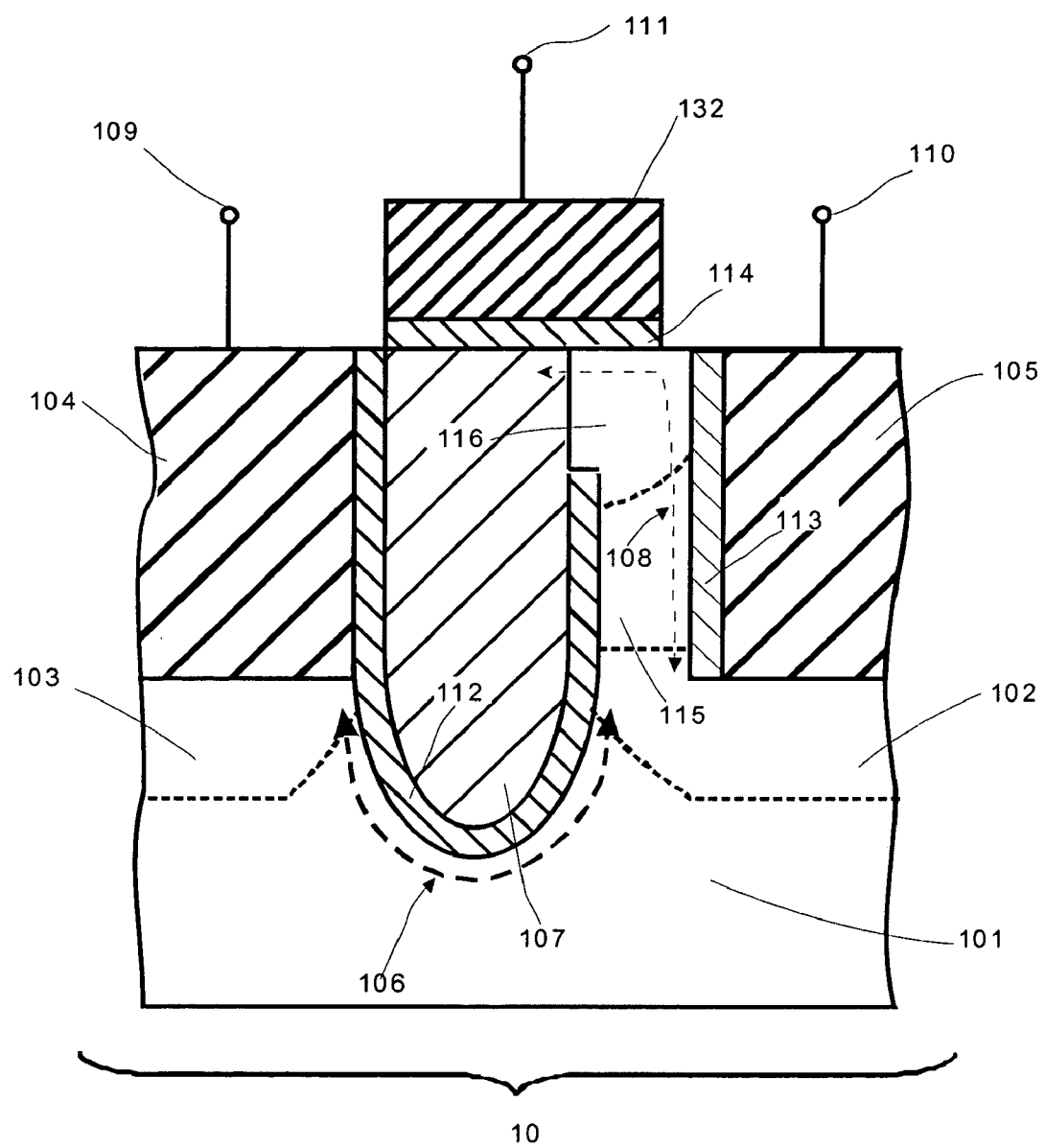
FIG. 1 illustrates an example cross-sectional view along the channel of one FJG memory device, according to one embodiment of the present invention.

FIG. 1 illustrates an example cross-sectional view of the disclosed semiconductor memory cell 10 called floating junction gate (FJG) memory device. The FJG memory device 10 is usually formed in a semiconductor substrate or doped well 101 which has a light n-type or p-type doping concentration, e.g. doping level lower than $2 \times 10^{18}$ cm$^{-3}$. The substrate material can be single crystal silicon or silicon on insulator. Source 103, drain 102 are usually anti-doped to well or substrate 101. The channel region 106 is between the source 103 and the drain 102. It is recessed into substrate 101 in order to increase the length of the channel. Region 103 acts as source of a MOSFET and it can be connected to an external electrode 109 directly or via a source contact plug 104. Region 102 acts as drain of a MOSFET and can be connected to an external electrode 110 directly or via a drain contact plug 105. When the FJG device is turned on, current can flow between the drain 102 and the source 103 through the channel 106 (refer to FIG. 1). A first gate dielectric layer 112 is disposed over the channel 106. A floating gate region 107 is formed over the dielectric layer 112 as a electrical storage node.

Said source 103 and drain 102 are recessed into said semiconductor substrate 101 and are in the range of 10-300 nm in depth. Said recessed channel 106 has a depth in the range of 50 nm to 400 nm and a width in the range of 20 nm to 500 nm.

Region 107 acts as a floating gate of MOSFET and the density of current flow through channel 106 can be controlled by changing the potential on the floating gate 107. The floating gate 107 is usually anti-doped against the drain 102. For example, the floating gate 107 is poly-silicon doped by p-type dopant and the drain 102 is doped by n-type dopant. The dopant in floating gate 107 diffuses out and form a diffusion region 116. As a result, a p-n junction diode can be formed with the out-diffusion region 116 and the drain 102. Said p-n junction diode may be a p-i-n diode when the region 115 between regions 102 and 116 has a lower doping concentration than $2 \times 10^{18}$ cm$^{-3}$. A dielectric layer 113 is disposed on the side wall of p-n junction or p-i-n diode and the drain contact region acts as gate of this gated diode. The anode of the gated diode is connected to the floating gate region 107 and its cathode is connected to the drain region 102; or, the cathode of the gated diode is connected to the floating gate region 107 and its anode is connected to the drain region 102.

A current path 108 can be induced with proper voltage conditions and electrical charges can flow through the current path 108 into or out from the floating gate 107. Namely, the floating gate 107 can be charged or discharged by current flowing through the current path 108. The logic state of the semiconductor memory device is determined by the number of charges stored in the floating gate 107. Because the floating gate 107 is connected to the p-n junction diode, this semiconductor memory device is called floating junction gate (FJG) memory device.

Region 114 is usually a layer of dielectric material, e.g. SiO2. It is deposited over the floating gate region 107 and extended to cover a portion or the whole area of the p-n or p-i-n diode. An electrically conductive material 132 is formed on the dielectric layer 114 as a control gate. This conductive material is connected to an external electrode 111. Because of the capacitive coupling effect, the voltage on the control gate 132 can impact the voltage on the floating gate 107. The length of the control gate 132 may vary, it may cover, not cover or partially cover the top of the p-n or p-i-n diode.

The first, second, third dielectric layer 112, 113, 114 are formed with dielectric materials such as silicon dioxide, silicon nitride, silicon oxynitride, or high-k dielectrics and are in the range of 30-100 angstroms in thickness.

Figure 2A:
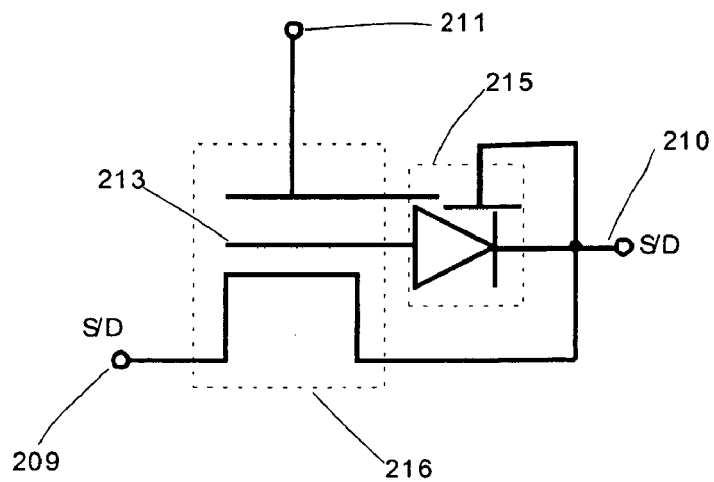
FIG. 2a-c illustrate example equivalent circuits of FJG memory devices, according to one embodiment of the present invention.
Figure 2B:
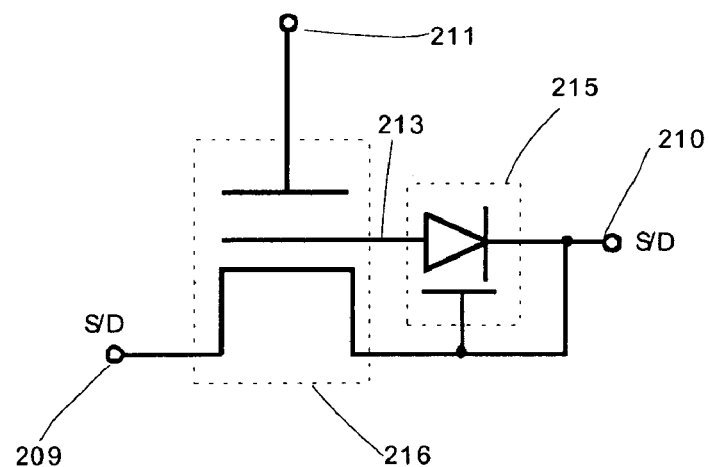
Figure 2C:
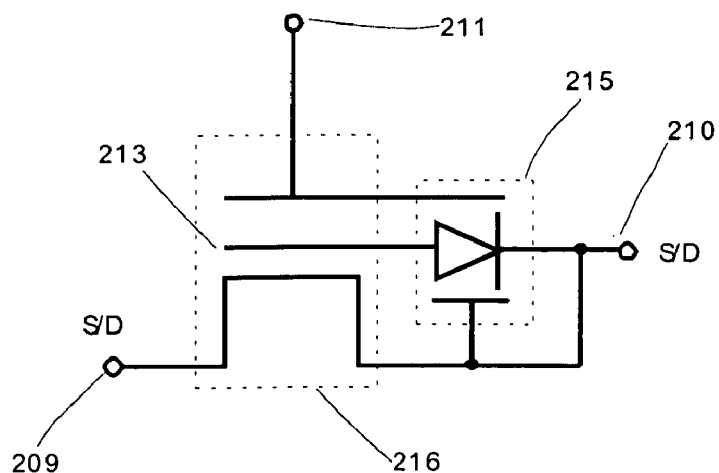

In order to further illustrate the configuration and functionality of the FJG memory device disclosed in the present invention, equivalent circuit diagrams of the FJG memory device are shown in FIG. 2a-c. As depicted in FIG. 2a-c, the FJG memory cell consists of a MOSFET 216 having floating gate and a diode 215 having a MOS gate. The MOSFET 216 has source/drain electrodes 209/210 and a control gate 211. The floating gate 213 is connected with the diode 215. Compared to conventional diode, diode 215 has MOS gates which can be connected to electrodes 210 and 211. In one embodiment of the present invention, the floating gate 213 is connected to the anode of the MOS-gated diode 215. With proper voltage settings on electrodes 211, 210, and 209, the floating gate 213 can be charged or discharged. As a result, the threshold voltage of MOSFET 216 will be affected by the charges stored inside the floating gate 213.

Three examples of FJG memory equivalent circuit diagrams are illustrated in FIG. 2. The control gate 211 of the FJG memory device in FIG. 2a covers partially the top of the p-n junction diode 215. The control gate 211 of the FJG memory device in FIG. 2b does not gate the p-n junction diode. The control gate 211 of the FJG memory device in FIG. 2c covers completely the top of the diode 215.

The detailed mechanism of writing and reading logic state "1" and "0" will be described in the following.

Figure 3A:
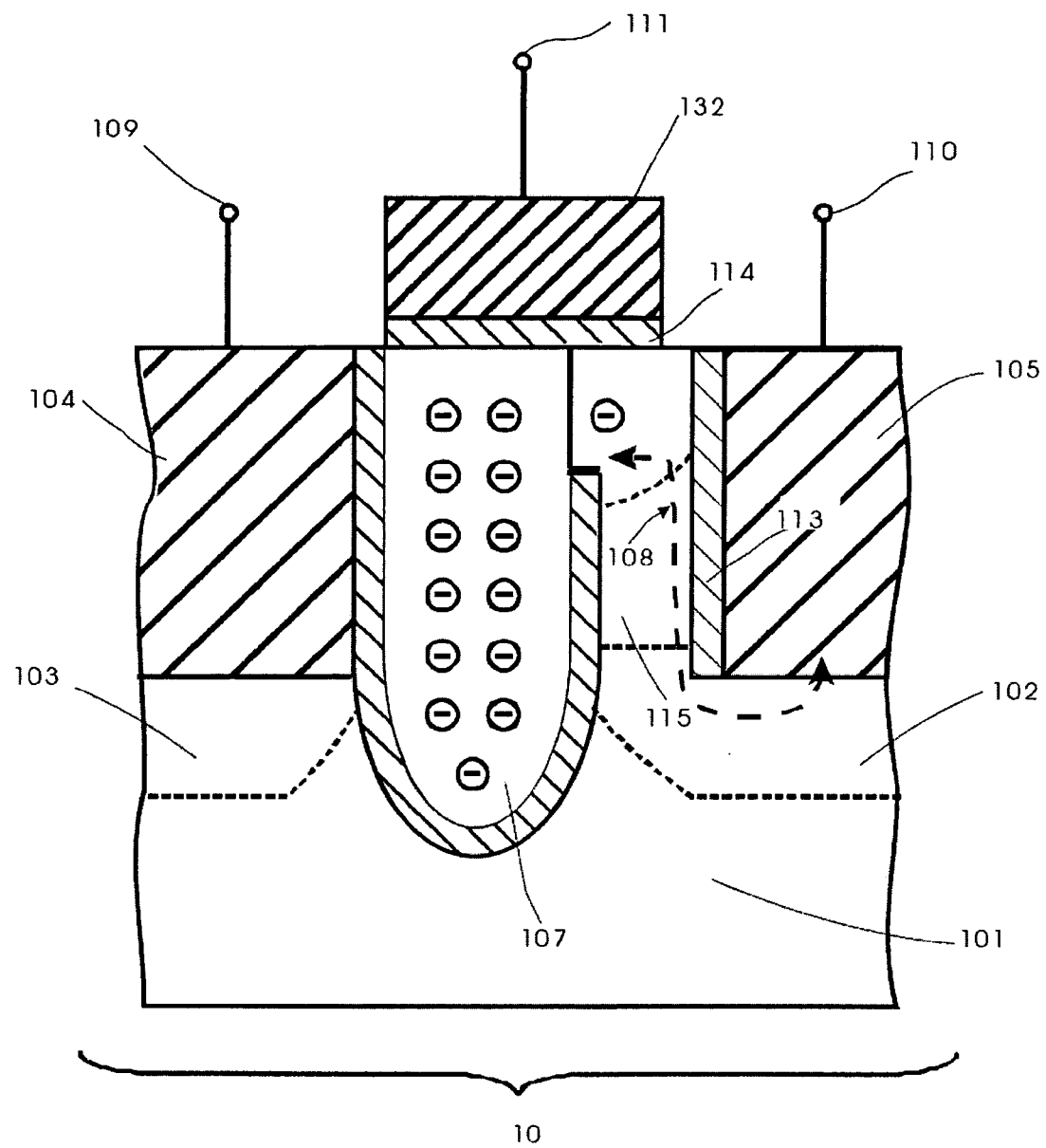
FIG. 3a-b illustrate examples of programmed FJG memory cells in state 0 and 1, according to one embodiment of the present invention.
Figure 3B:
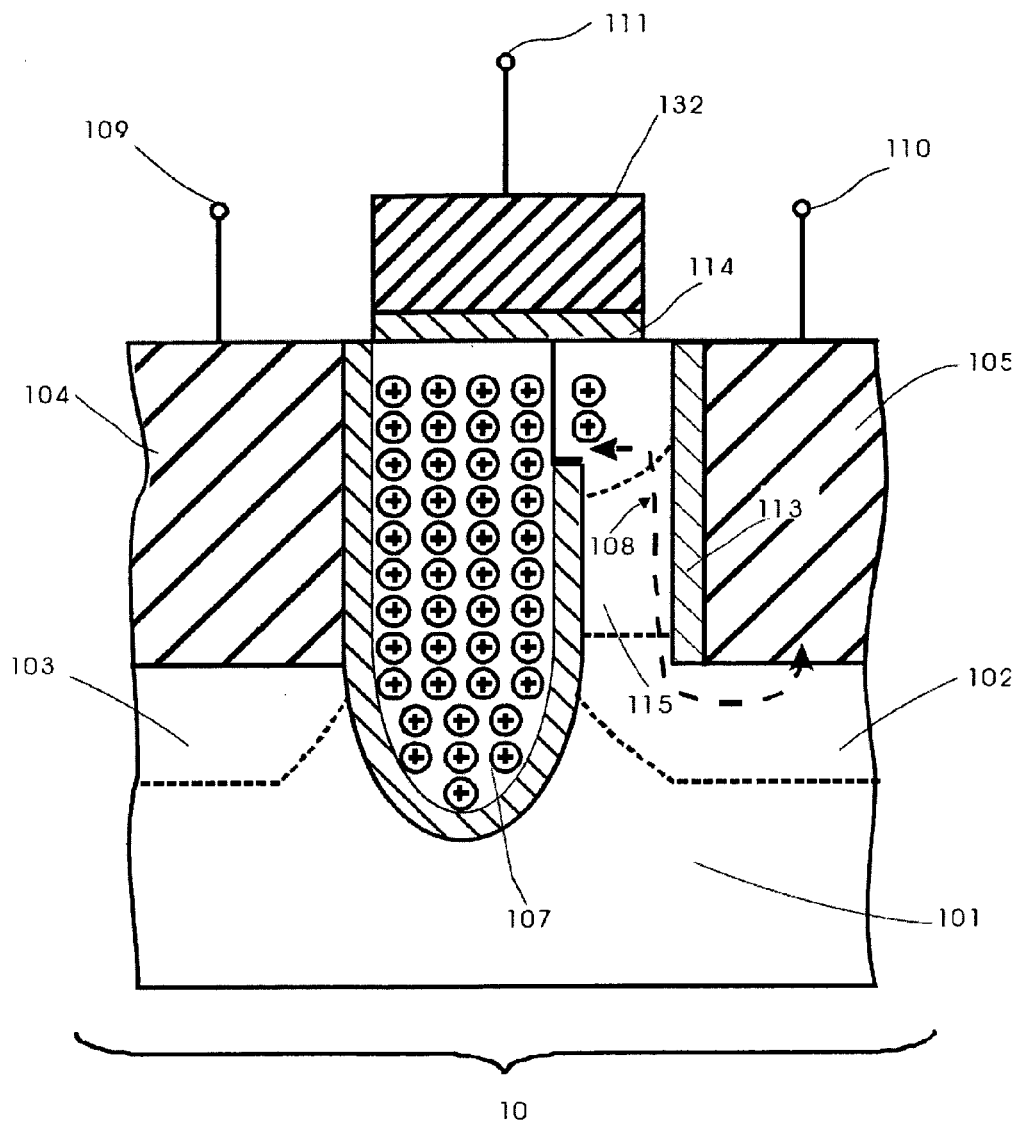

FIGS. 3a and b illustrate examples of programmed FJG memory cells 10 in logic state 0 and 1, respectively. In FIG. 3a, the FJG memory cell 10 has a logic state of "0", wherein negative charges are stored in the floating gate 107. FIG. 3b illustrates an example FJG memory cell with logic state "1", wherein positive charges are stored in the floating gate 107. The floating gate 107 of "1" FJG memory cell has a relatively higher potential (e.g. 1.0V) compared to the "0" FJG memory cell (e.g. 0V the floating gate).

In FIGS. 3a and b, logic state "0" is stored in FJG memory cell when floating gate 107 is charged with negative charges and logic state "1" is stored when the floating gate 107 is charged with positive charges. However, it is also valid that FJG memory cells with logic state "1" and "0" have different amount but same type of charges in the floating gate. For example, logic state "1" is stored when the floating gate 107 is charged with relatively more positive charges and logic state "0" is stored when the floating gate 107 is charged with relatively fewer positive charges. On the other hand, logic state "1" can be stored when the floating gate 107 is charged with relatively less negative charges and logic state "0" can be stored when the floating gate 107 is charged with relatively more negative charges.

According to the charge balance model, the charges stored in floating gate ($Q_{fg}$) can be derived as below:

$$Q_{fg} = C_{fg}(V_{fg} - V_{cg}) + C_s(V_{fg} - V_s) + C_d(V_{fg} - V_d) + C_{bb}(V_{fg} - V_{bb})$$

Further the floating gate voltage ($V_{fg}$) can be deduced:

$$V_{fg} = (Q_{fg} + C_{fg} \cdot V_{cg} + C_s \cdot V_s + C_d \cdot V_d + C_{bb} \cdot V_{bb})/(C_{fg} + C_s + C_d + C_{bb})$$

Where $C_{fg}, C_s, C_d, C_{bb}$ represents the capacitance of the control gate—floating gate, source—floating gate, drain—floating gate and substrate—floating gate capacitors, respectively. $V_s, V_d, V_{bb}$ represents the potential on the source, the drain and the substrate, respectively.

Figure 4A:
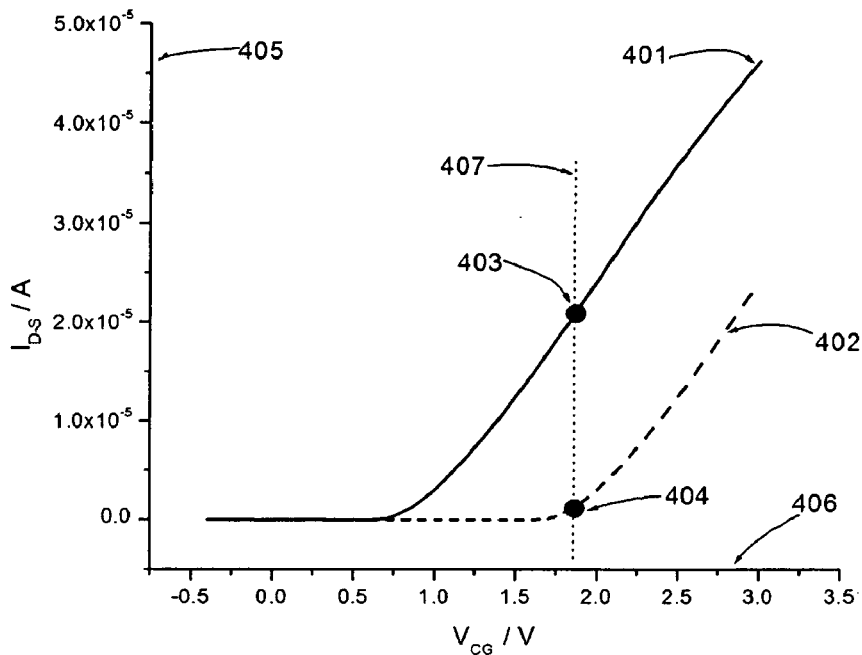
FIG. 4 a-b illustrate example transfer characteristics of FJG memory device with "1" or "0" state
Figure 4B:
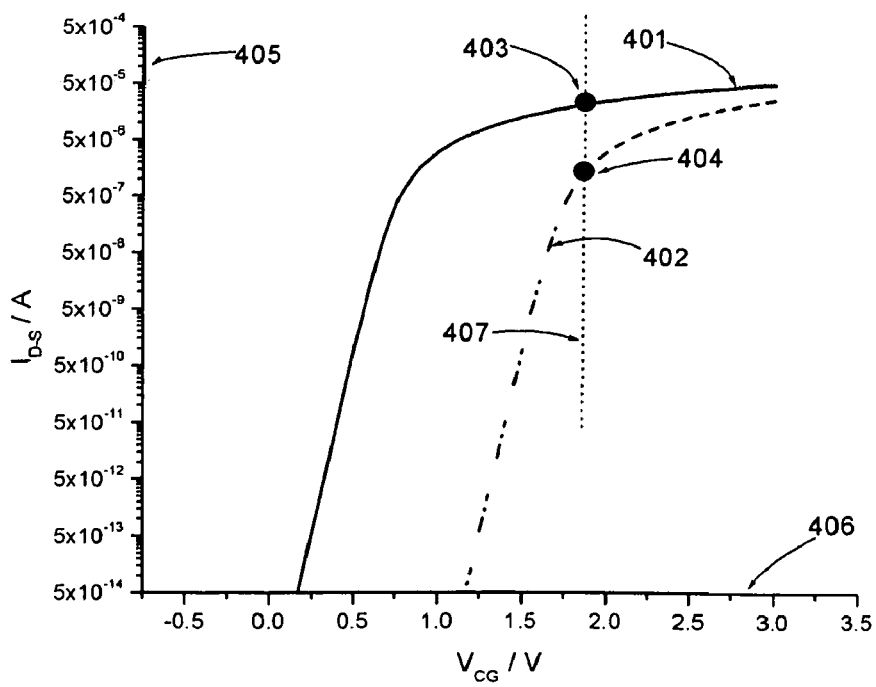
Figure 5A:
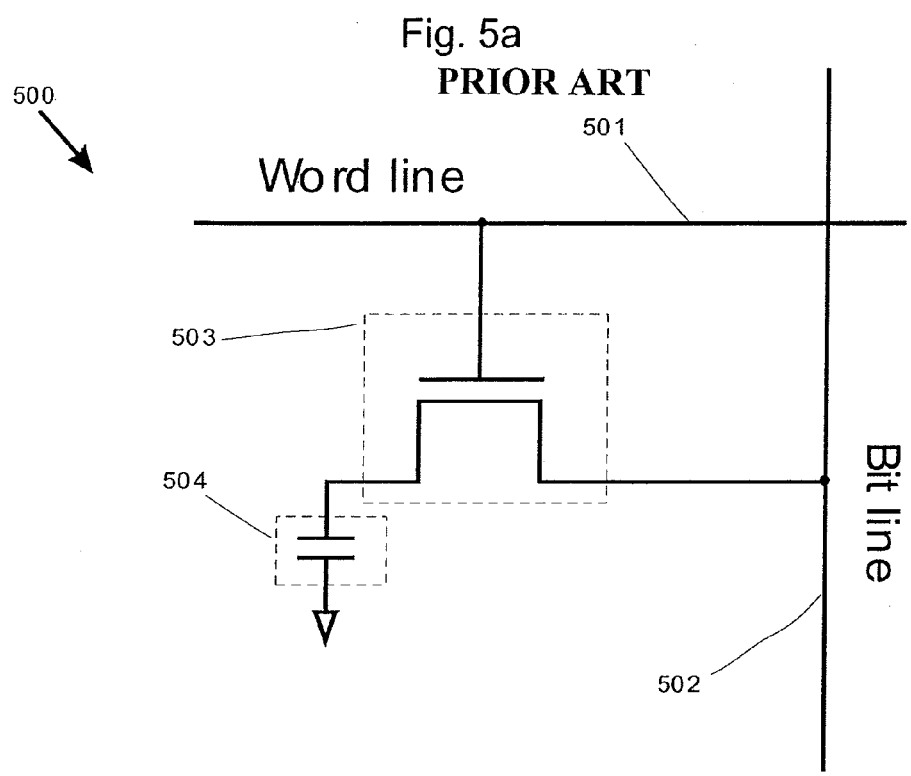
FIG. 5a-c illustrate memory cells of prior arts. 1T-1C DRAM is shown in FIG. 5a; floating body cell (1T-DRAM) is shown in FIG. 5b; 6T-SRAM is shown in FIG. 5c.
Figure 5B:
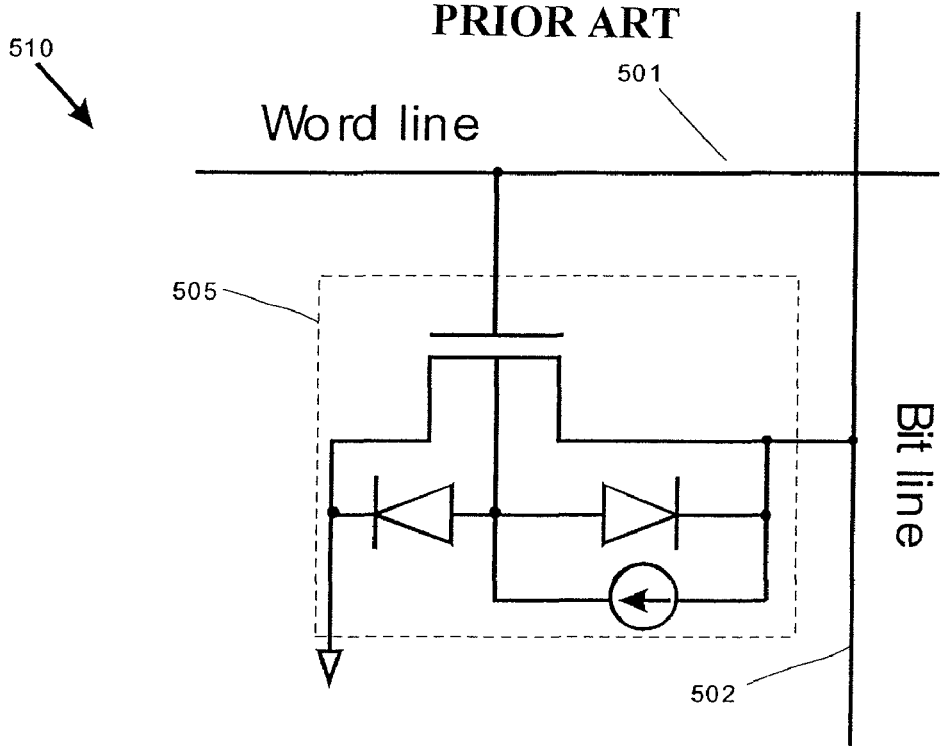
Figure 5C:
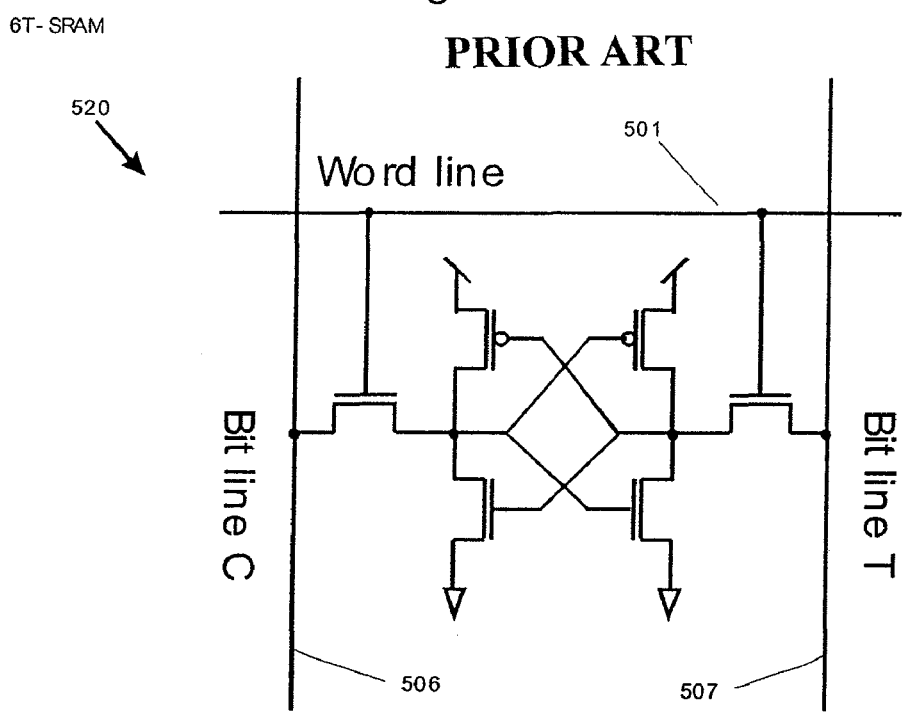

From above equations it can be seen that the floating gate potential $V_{fg}$ can be affected by charges stored in the floating gate ($Q_{fg}$) and the control gate voltage ($V_{cg}$). Meanwhile, when the floating gate voltage is higher than the threshold voltage ($V_{fg} > V_{th}$), the channel of MOSFET can be electrically turned on. That means, with proper setting, the FJG memory cell with a logic state "1" has a low threshold voltage and the device can be turned on with a defined gate voltage during reading. On the contrary, the FJG memory cell with a logic state "0" has a high threshold voltage and device cannot be turned on with the same defined gate voltage during reading. FIG. 4a and FIG. 4b illustrate transfer characteristics of an example FJG memory cell in linear scale and logarithmic scale, respectively. The x axis 406 represents the voltage of the control gate ($V_{cg}$) and the y axis 405 represents the drain-source current ($I_{D-S}$). The curve 402 represents an example transfer curve of a "0" cell and the curve 401 represents an example transfer curve of a "1" cell. Because of the different threshold voltages of memory cells at different logic states, $I_{D-S}$ have different values with the same voltage setting. For example, with the same $V_{cg}$ chosen by the line 407, the corresponding $I_{D-S}$ of the memory cell with "1" state is around 20 μA at the point 403. While the corresponding $I_{D-S}$ of the memory cell with "0" state is around 1 μA at the point 404. The difference in $I_{D-S}$ between points 403 and 404 is around 19 μA which is big enough to be sensed in a few nano-seconds by using proper sensing method. Therefore the logic bit stored in the memory device can be read.

FIG. 6 illustrates an example memory cell 600 formed by a FJG memory device 603, according to one embodiment of the present invention. A word-line (WL) 601 is coupled to the control-gate 211 of the FJG memory device 603 and a bit-line (BL) 602 is coupled to the drain 210 of the FJG memory cell 603. The source 209 is coupled to node 604. which can be connected to source line (SL) with specified voltage. The FJG memory device 603 can be any type of the FJG memory devices shown in FIG. 2.

Example voltage settings for operating the FJG memory cell 600 are shown in FIG. 7. For example, by setting word line (WL) 601 voltage to 2.5 V and bit-line (BL) 602 voltage to 0V, the p-n junction diode 215 between the control gate 213 and the drain 210 is forward-biased.

Current will flow from the floating gate 213 to the drain 210 and pull down the floating gate potential. The threshold voltage of the FJG memory device 603 will be raised. Namely, a "0" is written into the FJG memory cell 600. On the other hand, when the WL 601 voltage is set to −2.8 V and the BL 602 voltage is set to 1.8 V, the p-n junction diode 215 becomes reverse-biased. Current will flow from the drain 210 to the floating gate 213 and pull up the floating gate potential. The threshold voltage of the FJG memory device 603 will be lowered. Namely, a "1" is written into the FJG memory cell 600. Usually, the current of a traditional reverse-biased p-n junction diode is much smaller than in the case of forward biased. In order to enhance the current through a reverse-biased p-n junction diode, a MOS-gate is applied over the p-n junction diode. With a proper voltage setting, the reverse current of a MOS-gated p-n diode can have an enhanced current density, e.g. 1 μA/μm with −1.8 V reverse bias, which enables writing "1" into the FJG memory cell 600 in a few nano-second.

An example voltage setting for reading the FJG memory cell 600 is also shown in Table. 1. For example, set the BL 602 voltage to 1.0 V, the SL voltage to 0 V, and the WL 601 voltage to 2.5 V, the current flowing through the FJG transistor will have different intensity depending on its logic state stored. Because the FJG device with logic state "1" stored has a lower threshold voltage compared to the FJG device with "0" stored, the current density that flows through the FJG memory cell with "1" stored is larger. There are many methods to sense the current difference and read the information stored in the FJG memory cell. For example, by comparing current intensity using a current sensor, the logic state stored in FJG memory cells can be distinguished.

An example voltage setting for FJG stand-by condition is also given in FIG. 7. For example, by lowering the WL 601 voltage to 0 V, the FJG cell 600 will be switched off. Meanwhile, a higher BL voltage than write "0" condition, e.g. 0.5 V, is set to hold the charges in the floating gate 213.

For memory cells, sufficient long data retention time is very important. The data retention time indicates how long the data can be stored in the memory cell before it is lost. Usually a refresh or write-back operation is needed before data is lost. The data retention time is around 10 seconds and 100 ms for the stand-alone 1T-1C DRAM cell and the FBC memory cell, respectively. For FJG memory cell, the data retention time can be as long as 10 seconds. That is due to the low leakage of the diode e.g. current density below $1 \times 10^{-7}$ A/cm². That means the reverse current for diode with 100 nm width and 50 nm height is in the range of $5 \times 10^{-18}$ A. Data can last over 10 seconds for a FJG memory cell with a floating gate capacitance of 0.25 fF and 0.2 V signal margin. With a smaller diode dimension, the data retention time can be even better. Hence, the data retention performance of FJG memory cell is comparable to the stand-alone 1T-1C DRAM cell.

Figure 8:
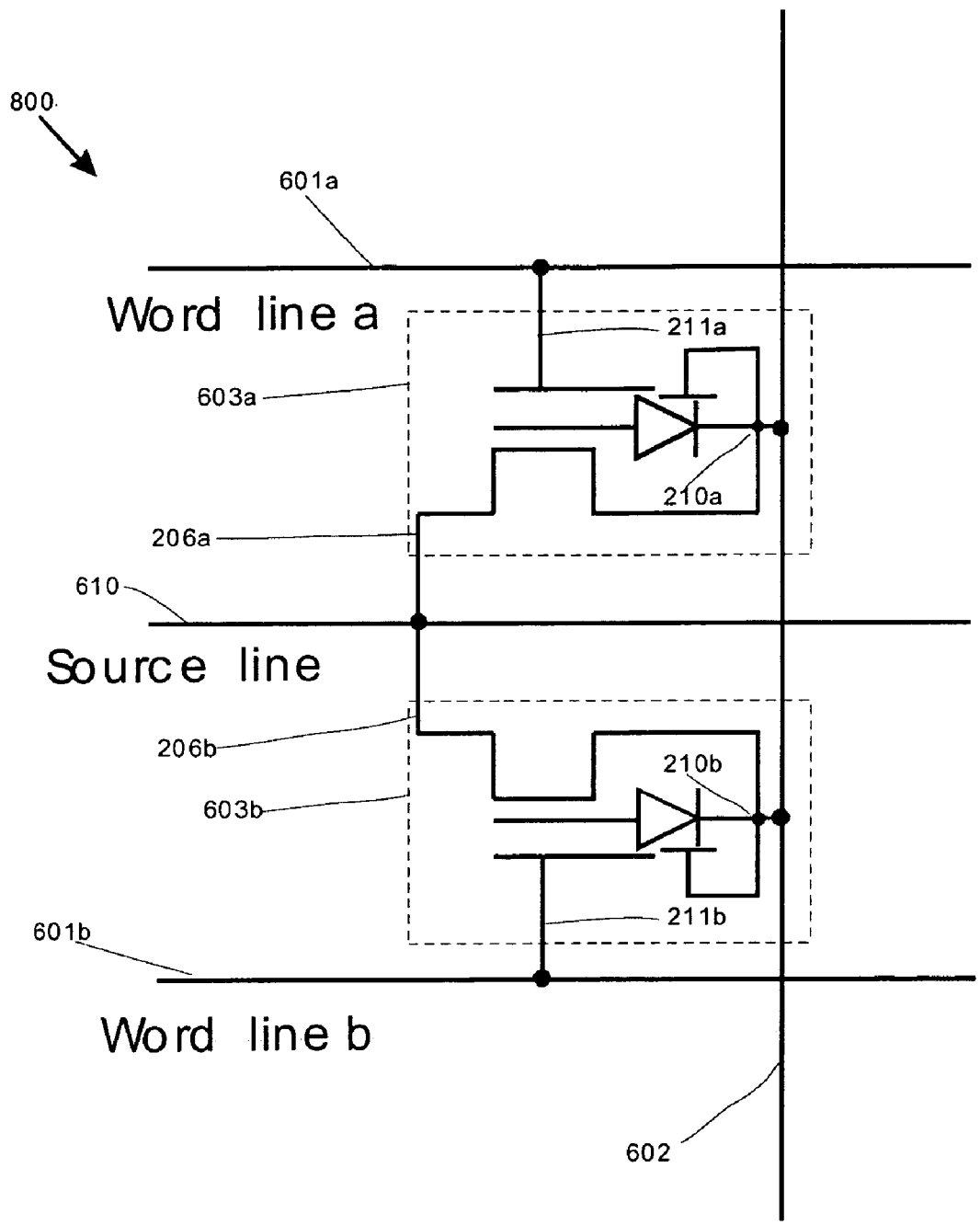
FIG. 8 illustrates example twin memory cell formed by two floating junction gate semiconductor devices, according to one embodiment of the present invention.

FIG. 8 shows an example configuration of a twin memory cell 800 which can store 2 bits. This twin memory cell is formed by two single FJG memory cells 603a and 603b. Their sources 206a and 206b are connected to a common source line (SL) 610. Drains 210a and 210b of two FJG memory cells are connected to the bit line (BL) 602. 601a and 601b are two word lines connected to the control gates 211a and 211b of two FJG memory cells respectively.

Figure 9:
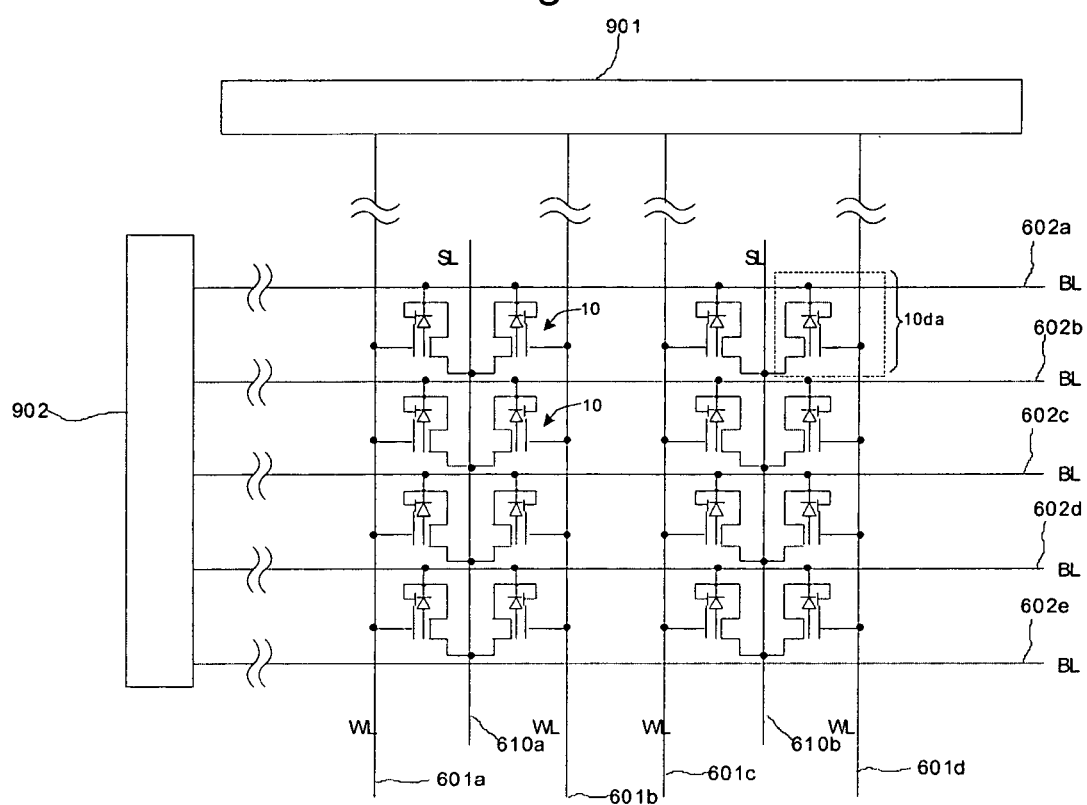
FIG. 9 illustrates an example memory array made up of a plurality of floating junction gate semiconductor devices, according to one embodiment.

Further, according to one of the claims of the present invention, a memory array configured by a plurality of FJG memory cell 10 can be formed. As shown in FIG. 9, the common source line (SL) is coupled to the source of the FJG memory device 10; one of the plurality of word line 601a~601d is coupled to the control gate of one of the plurality of FJG memory device 10; one of the plurality of bit line 602a~602e is coupled to the drain of one of the plurality of FJG memory device 10. Each combination of one of the plurality of word lines and one of the plurality of bit lines selects a single semiconductor FJG memory cell. For example, when accessing one FJG device 10da, the word-line 601d, bit-line 602a, and source-line 610b are activated. The word-line 601d can be selected by the word-line address decoder 901. The bit-line 602a can be selected by a bit-line select control block 902 which can consist of decoder, multiplexer, and sense amplifier. Meanwhile, source line 610b can be connected to a common source line (SL) or a source-line select control block.

Method of Manufacturing

The described schematics of the FJG memory cell in the present invention can be implemented in various architectures as described in the following.

FIGS. 10 to 20 schematically depict processing steps for producing an array of FJG memory cells, wherein the transistor comprises a recessed channel, a gated p-n junction diode, a floating junction gate, and source/drain recessed below the original surface of the wafer.

Although the figures are not drawn to scale they show the relative arrangement of areas and elements to each other, in particular which elements are adjacent and which element is on top of another.

Figure 10A:
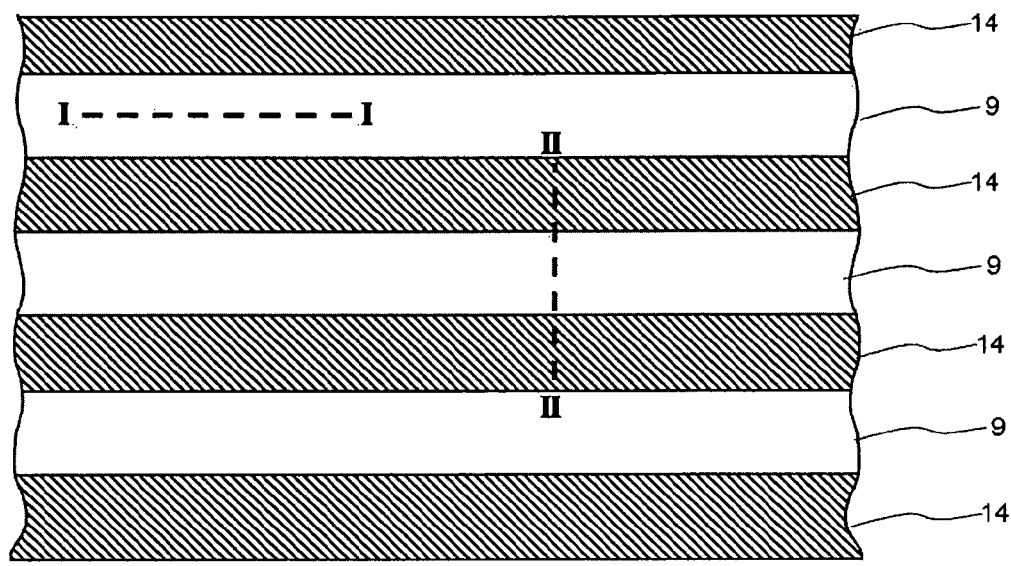
FIGS. 10 to 20 illustrate method of manufacturing FJG memory array according to one embodiment of the present invention.
Figure 10B:
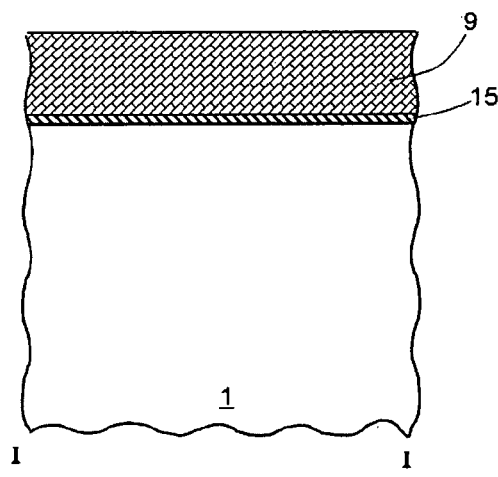
Figure 10C:
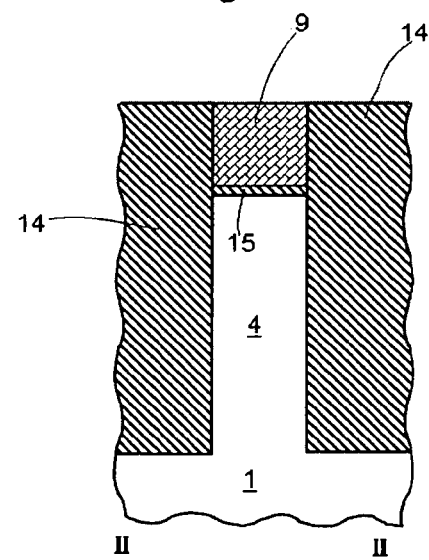

FIGS. 10a to 10c show the beginning of the manufacturing process. FIG. 10a depicts a top view after a dielectric chemical-mechanism-planarization (CMP) step of shallow-trench-isolation (STI) processes. The cross section along the active area 4 between the cut-line I-I is shown in FIG. 10b. The cross section perpendicular to the active area 4 between II-II is shown in FIG. 10c.

On a silicon substrate 1, an active area 4 is patterned by STI processes which is generally known in the art. A cap-nitride layer 9 sits on the buffer layer 15 covering the active area 4. The neighboring active area regions are separated by trench isolation. The isolation dielectrics 14 can be high-density-plasma (HDP) oxide or spin-on-glass (SOG) oxide. The space between two active area lines is usually about one feature size (1F). The depth of the isolation trench is around 250 nm.

Figure 11A:
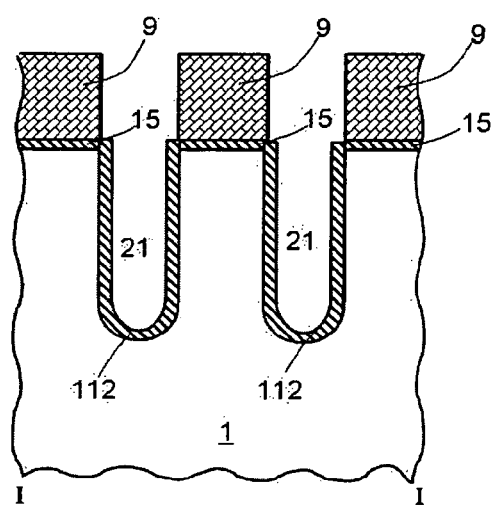
Figure 11B:
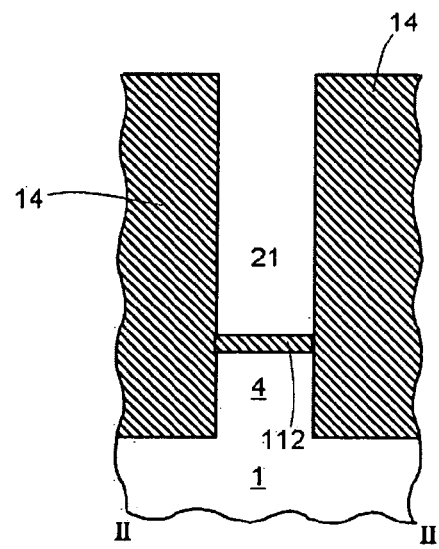
Figure 11C:
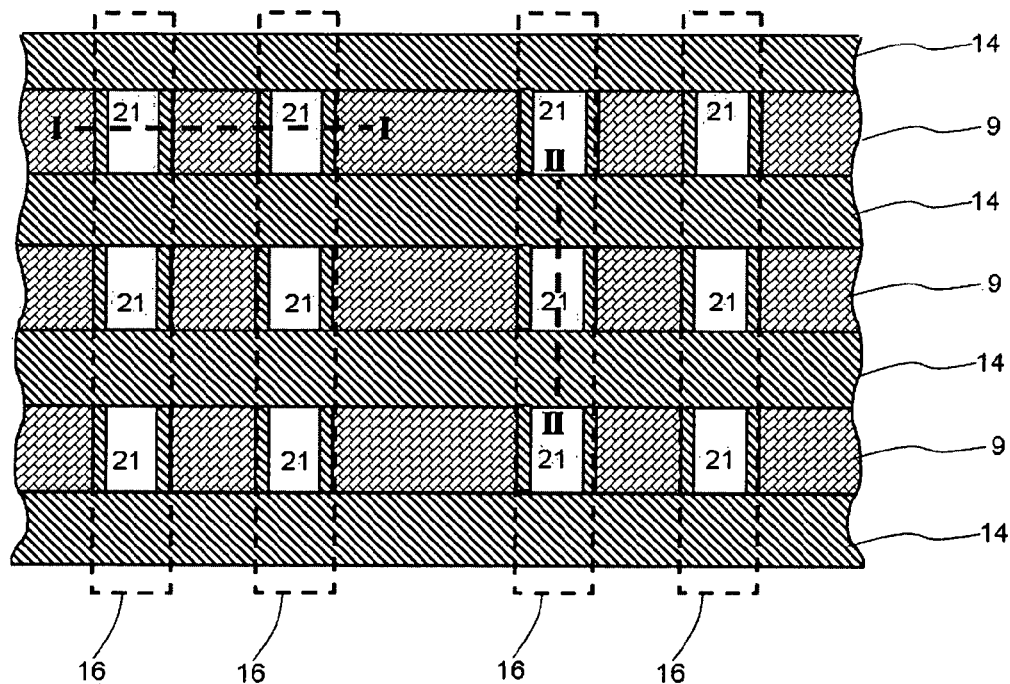

In the next step, a hard-mask layer is deposited followed by a lithography process. Using a mask with line pattern as shown in FIG. 10c, the region in line 16 is opened after lithography. The pattern is transferred to a hard-mask layer using a reactive ion etch (RIE) process. FIG. 10a is a cross-sectional view along the cutline I-I drawn in FIG. 10c. A trench 21 is formed by using RIE processes. In the first step, the cap-nitride layer 9 is etched selectively to the isolation material 14. Then an oxide breakthrough step is applied to remove the buffer layer 15. A further Si etching step selective to material 14 creates a trench 21 in the Si substrate 1. FIG. 11b shows the cross section along the cutline II-II drawn in FIG. 11c. The trench 21 is formed by etching through the cap-nitride layer 9, buffer layer 15, and further etching into the active area 4. A local channel ion implantation can be performed after the trench formation in order to tune the threshold voltage of the transistor. Finally, after certain surface treatment to remove etching residue, a gate dielectric layer 112 is grown or deposited.

Figure 12A:
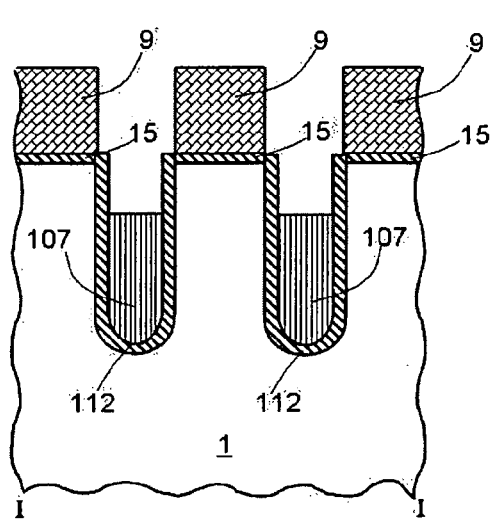
Figure 12B:
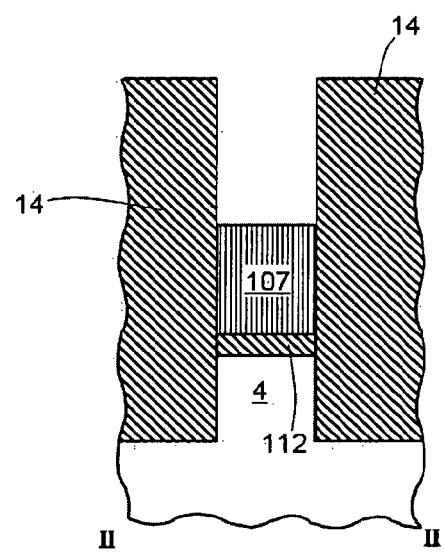

FIGS. 12a and 12b show the later process steps of forming the first portion of the floating gate.

FIG. 12a depicts a cross-sectional view along the cut line I-I after a conduction layer 107 is deposited and further recessed as the portion of floating junction gate. The conductor recess process can be realized by isotropic etch. The top of conductor 107 is usually below the original silicon surface. The material of 107 may be p type poly-silicon, tungsten, titanium nitride or alloy.

FIG. 12b shows a cross-sectional view along the cut line II-II after the first portion of floating junction gate is recessed. Because the recessed conductor 107 is confined in the recessed channel 21, it is separated from the neighboring recessed conductor.

Figure 13A:
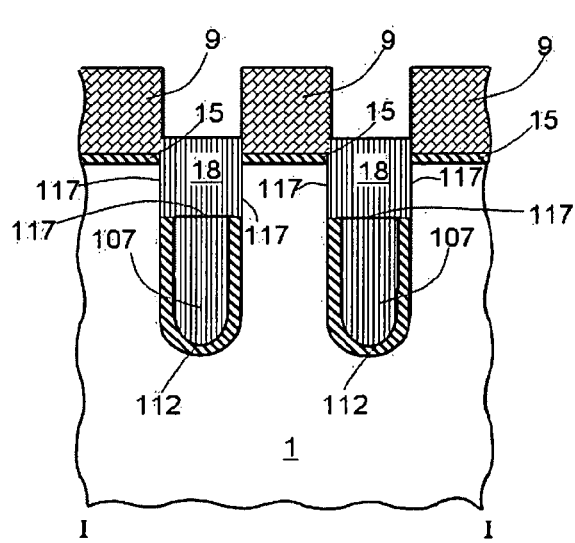
Figure 13B:
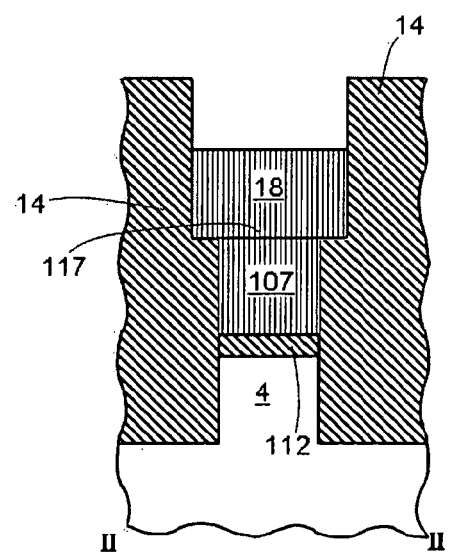
Figure 14:
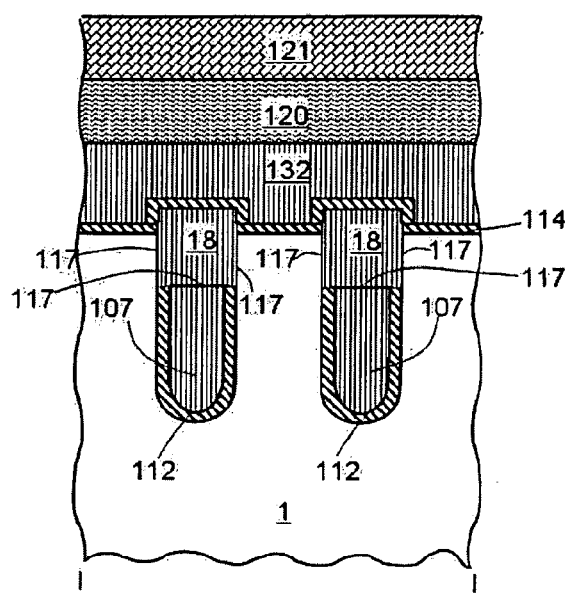
Figure 14:
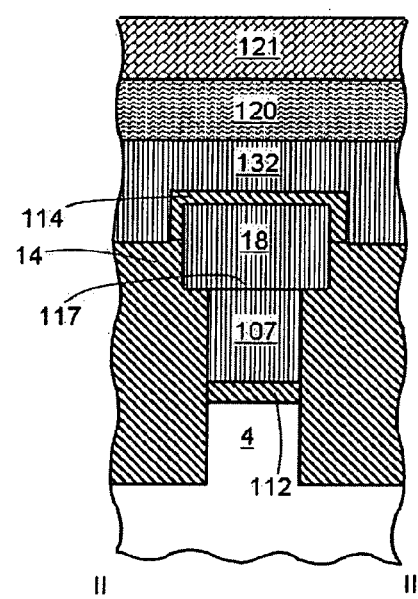

FIGS. 13a and 13b depict the chip at a later processing steps after the second portion of the floating junction gate is formed.

In FIG. 13a a cross-sectional view through the active area along the cut line I-I is shown. Using a isotropic dielectric etching process, part of the dielectric layer 112 and isolation dielectric 14 is removed self-aligned to the recessed conductor 107 and then stop on silicon substrate 1. At the same time, the portion of gate dielectric 112 covered by conductor 107 is protected from this etch process. A very thin (e.g. 5 angstroms) interface layer 117 can be formed after an interface treatment.

The interface layer 117 can be a very thin nitride or oxide layer. Subsequently a conductor material (e.g. poly-silicon or a metal) can be deposited and subsequently isotropically recessed to form the second portion of floating gate 18. FIG. 13b depicts the cross-sectional view through the cut line II-II, where a second portion of floating gate 18 is formed. Due to native oxidation or intended interface treatment, an interface layer 117 between region 18 and 107 exists. P-type doping is preferred for region 18 and 107. Occasionally, the interface layer 117 it is used to reduce the out-diffusion of the boron dopant out of the floating gate 18.

FIGS. 14a and 14b show the later process steps after control gate conductor stacks are deposited.

FIG. 14a depicts the cross-sectional view along the cut line I-I. After the second portion of floating gate is formed with regard to FIGS. 13a and b. A wet etch process is performed to recess the isolation material 14. Then the cap-nitride 9 is stripped by wet chemistry such as hot phosphoric acid. In a next step, the buffer layer 15 over the active area 4 is removed and a dielectric layer 114 such as silicon oxide or high-k material is then grown or deposited. Subsequently, the word-line conductor stack is deposited. The illustrated word-line stack comprising a first, a second, and a third material layer 132, 120, and 121 may serve as one example of a word-line stack. Layers 132 and 120 can be poly-silicon, metal or alloy. Layer 121 can be a dielectric material such as nitride.

FIG. 14b shows a cross section along the cut line II-II. The second gate dielectric 114 sits between gate conductor 132 and upper portion of floating junction gate 18 in this figure.

Figure 15A:
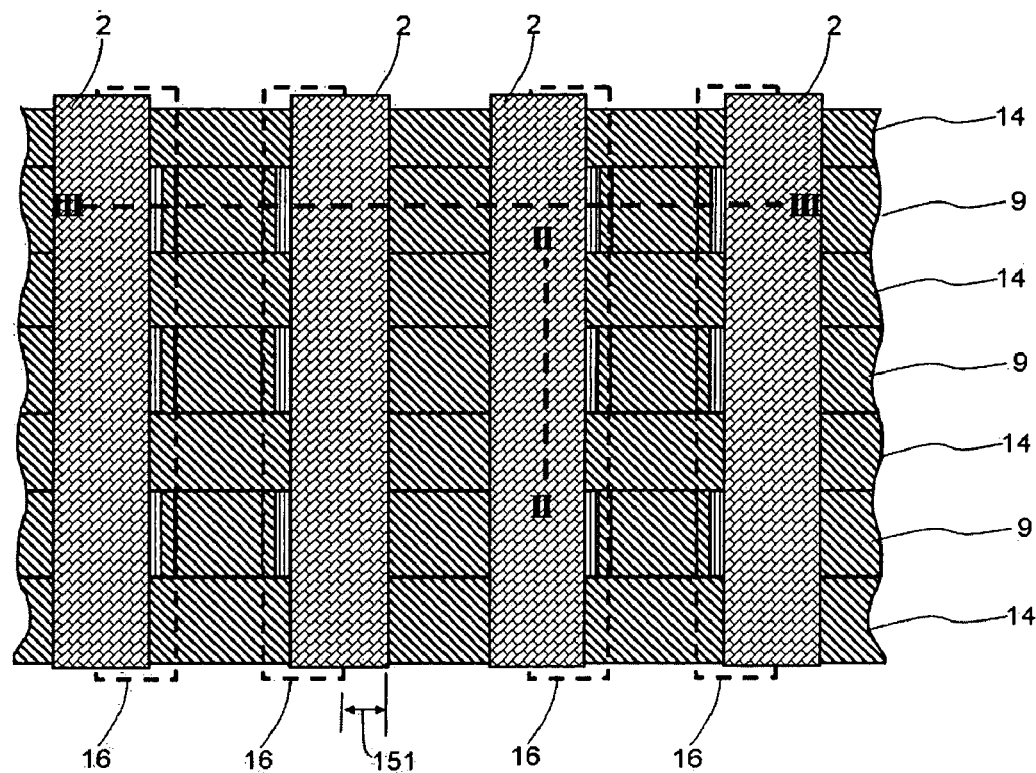
Figure 15B:
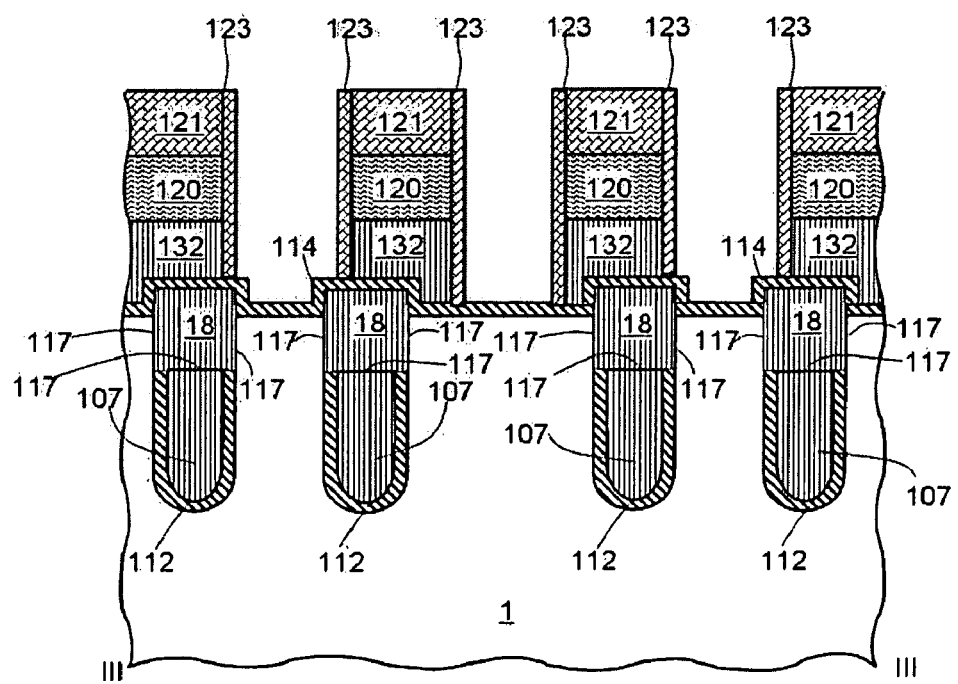

FIGS. 15a to 15c depict later process steps after word-line and word-line spacers are formed.

FIG. 15a illustrates a plan view after word line is patterned by etching steps. The patterning of word line 2 is generally known in the art. A lithography process is performed to form line patterns. Then the line pattern can be transferred to the dielectric layer 121 by etching processes. In the next step, RIE processes etch through the gate conductor layer 120 and 132 using the gate dielectric layer 114 as an etch-stop layer. In order to form diode later on, an offset region 151 between edges of line 2 and 16 is required. The range of the offset region 151 is from 5 nm to 60 nm in width.

FIG. 15b illustrates a cross-sectional view between III-III from FIG. 15a. As can be seen, the word-line stack has been formed. Subsequently, the word-line spacer 123 is formed by depositing a dielectric liner. The spacer material 123 can be nitride or oxide liner. The word-line width and spacing is around 1F (F is the feature size).

Figure 16A:
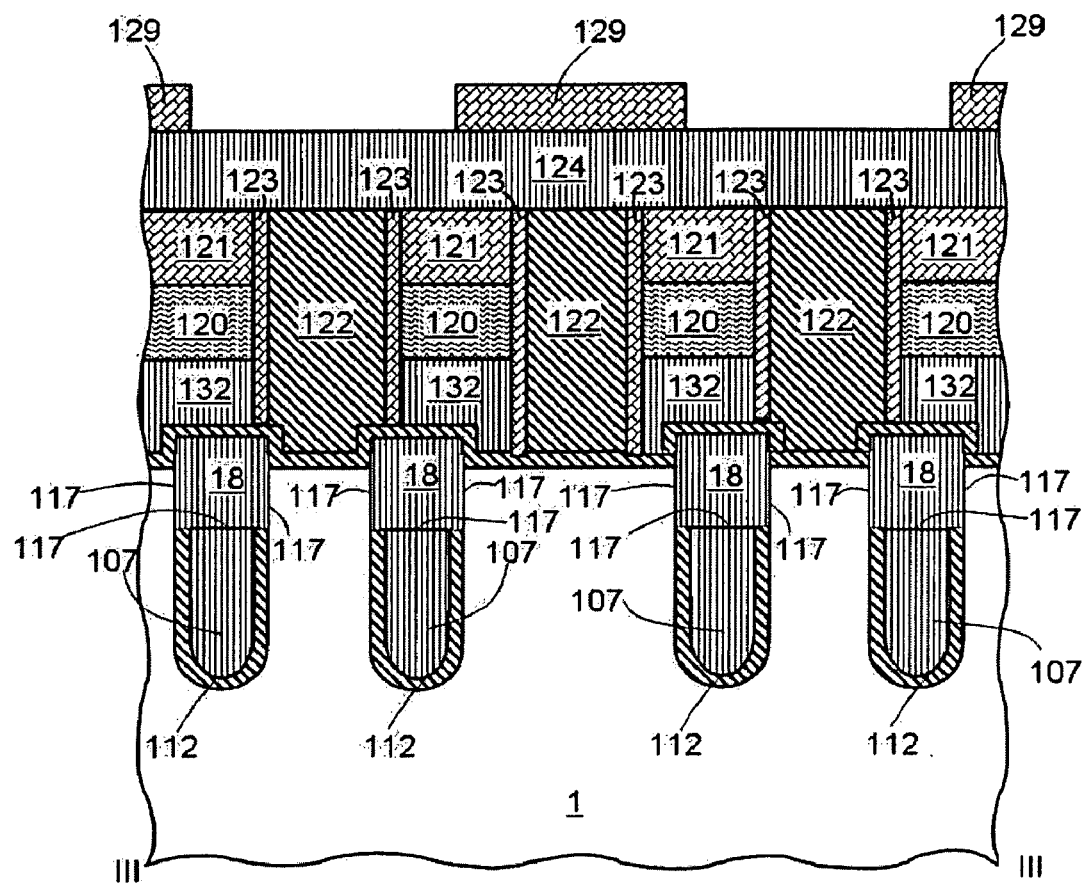
Figure 16B:
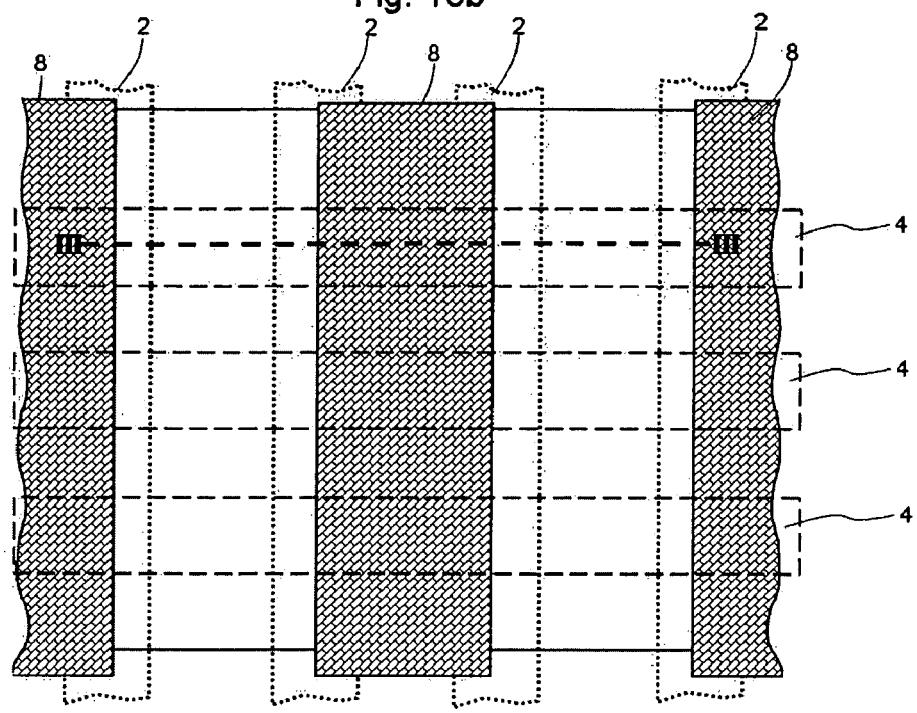
Figure 17:
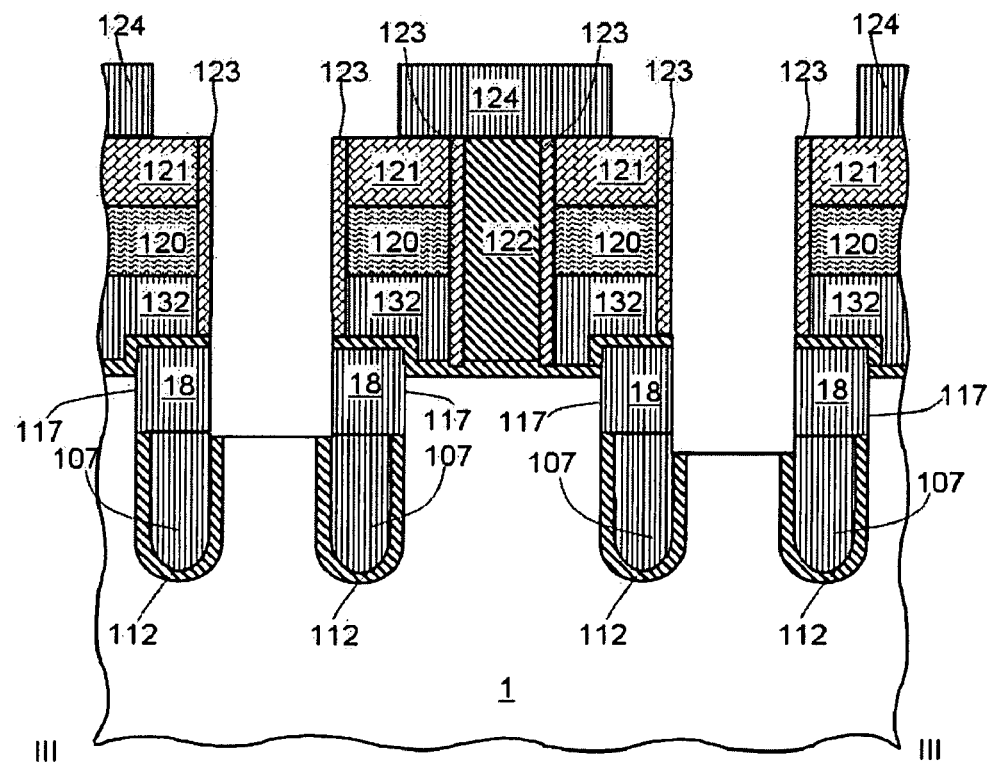

FIGS. 16a and 16b depict the cross-sectional view and plan view after source-line hard-mask is patterned respectively.

FIG. 16a illustrates a cross-sectional view along the active area 4 between the cut line III-III from FIG. 16b. After the word-line spacer is formed with regard to FIG. 15b, an oxide layer is deposited and planarized by a CMP process. As can be seen, the oxide layer 122 is planarized to the same level as the surface of the dielectric layer 121. Then a first hard-mask such as poly-silicon 124 and a second hardmask 129 are deposited. In the next step, the hard-mask 129 is patterned using dry etching process after a lithography process. A plan view after patterning of nitride hard-mask 129 is shown in FIG. 15b. The patterned source-line hard-mask 8 has a line shape which sits in the middle of two word-lines. The width of the source-line is normally 2F, thus it partially overlaps adjacent two underlying word-lines 2.

Performing a dry etching process, the pattern of layer 129 is transferred to the underlying hard-mask layer 124. Then oxide 122 can be stripped with diluted hydrofluorine acid. A further etching process breaks through the word line spacer 123 and subsequently etch into the floating gate or substrate. The resulting structure is shown as FIG. 17 wherein portion of the floating gate 18 and substrate silicon 1 has been etched.

Figure 18A:
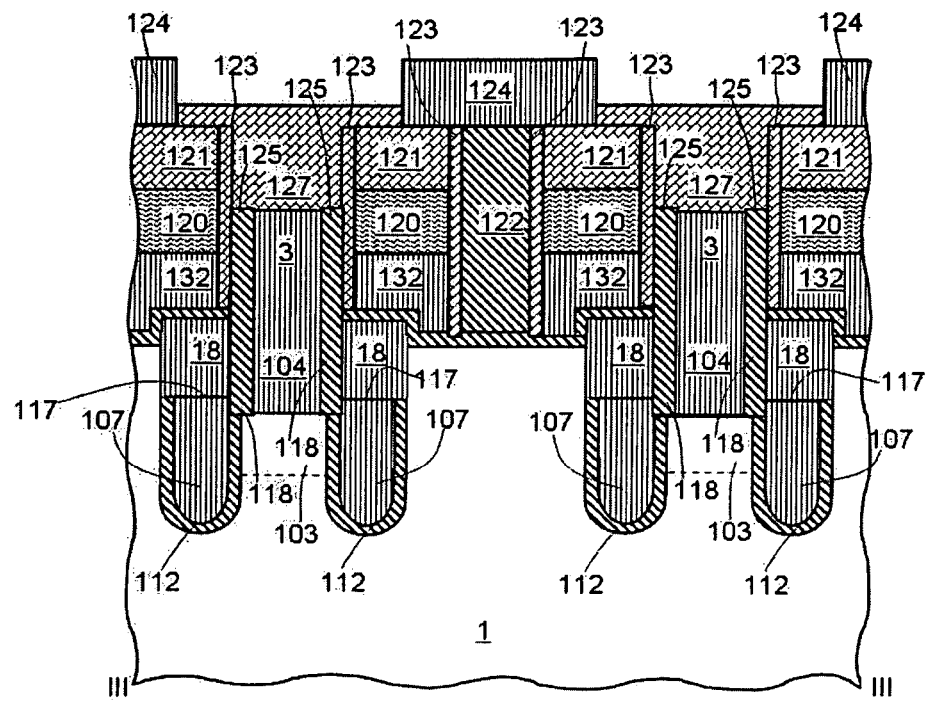
Figure 18B:
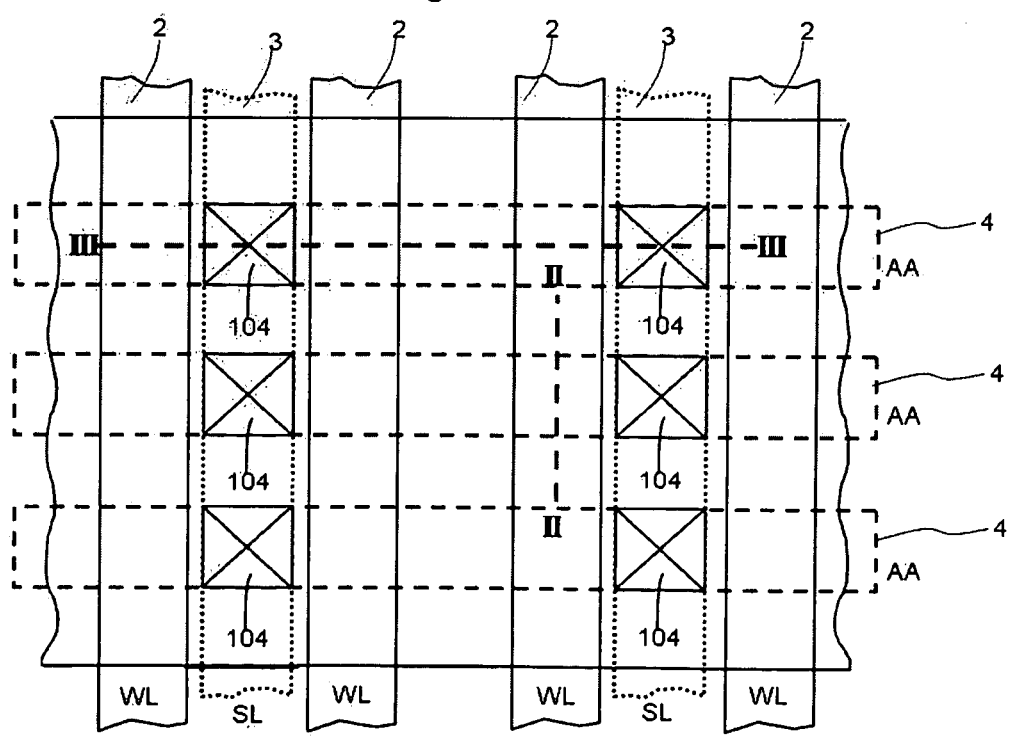

FIG. 18a and FIG. 18b illustrate the cross-sectional view and plan view after source line 3, source line insulating cap 127, source region 103 and source-line inner spacer 118 are formed, respectively.

In order to isolate the source line 3 and the source line contact 104 from the floating gate 18, a spacer 118 is formed by performing a conformal dielectric liner deposition and an anisotropic etch as shown in FIG. 18a. An ion implantation process is performed to dope the source region 103 of FJG memory cell at the source-line side. Then source line conductor 3 such as heavily n-type doped poly-silicon or a metal is deposited and isotropically recessed. The lower portion of the source line 104 is a contact plug which contacts the source region 103. The source-line cap-isolation 127 is formed by depositing an insulator such as silicon-nitride and subsequently recessed by an isotropic etch process. The top of the cap-isolation layer 127 is below the surface of the hard mask 124.

In FIG. 18b, the top view illustrates the layout of word-line 2, source-line 3, active area line 4, and source line contact 104. As can be seen, source line 3 is parallel to word-lines and sits between two adjacent word-lines 2. Source-line 3 and active area line 4 are connected via a source-line contact 104.

Figure 19:
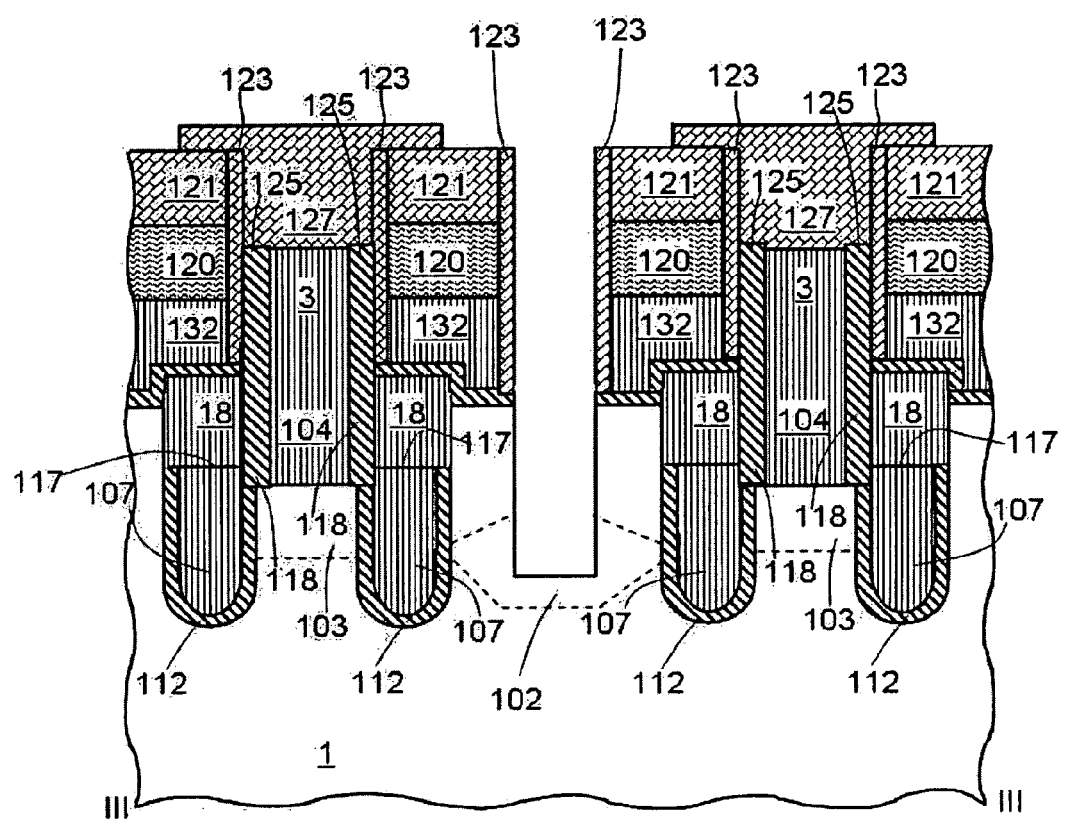

FIG. 19 illustrates a cross-sectional view after the drain of the FJG device is recessed.

After the source-line cap-insulator 127 is formed as illustrated in FIG. 18a, the poly-silicon hard-mask 124 is exposed and stripped selectively to the source-line cap-insulator 127 and word-line cap-insulator 121. Using diluted hydrofluorine-acid, oxide 122 can be stripped due to the high etching selectivity to nitride 127, 123 and 121. A dry silicon etch followed by ion implantation can recess into the silicon and form the drain region of the FJG device. The depth of recessed drain is around 160 nm below the original silicon surface.

Figure 20A:
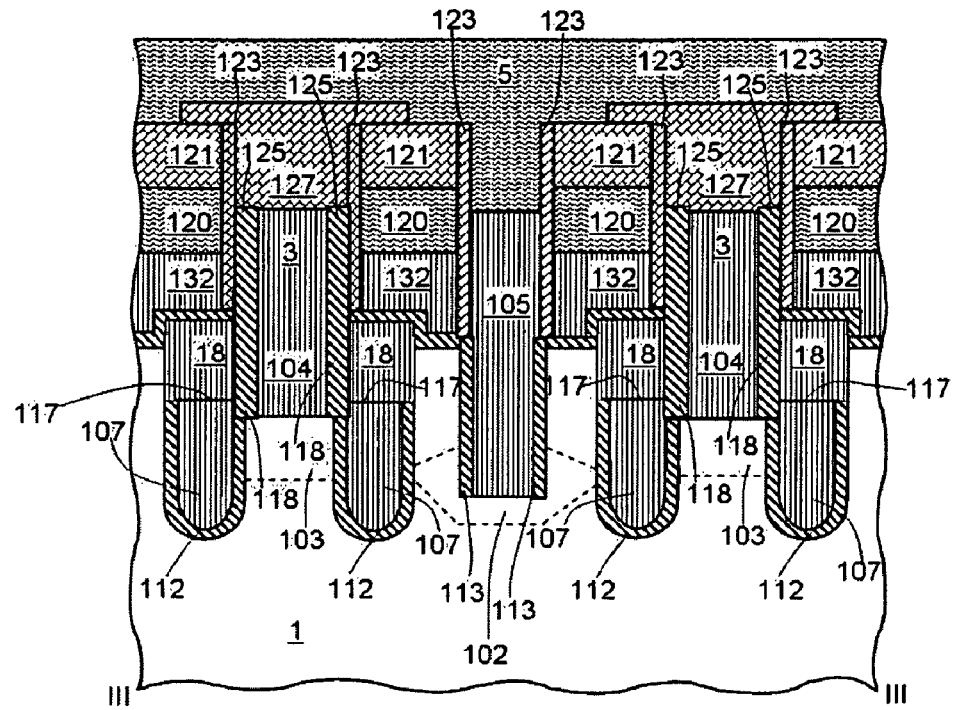
Figure 20B:
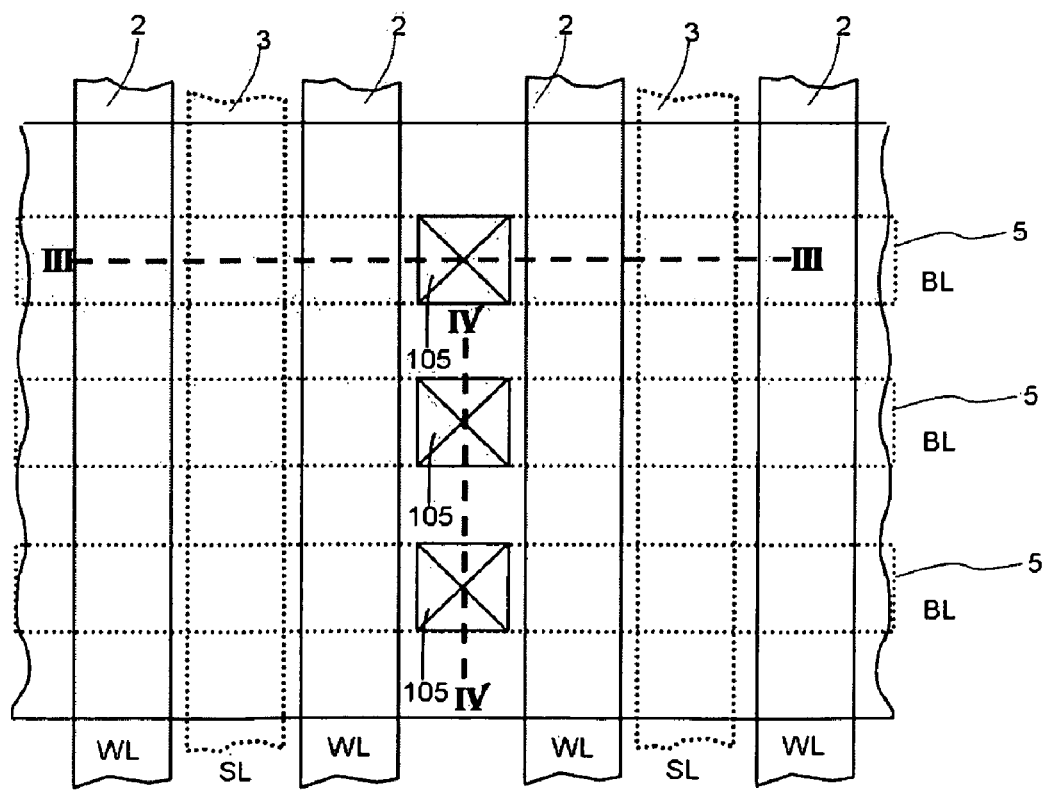
Figure 20C:
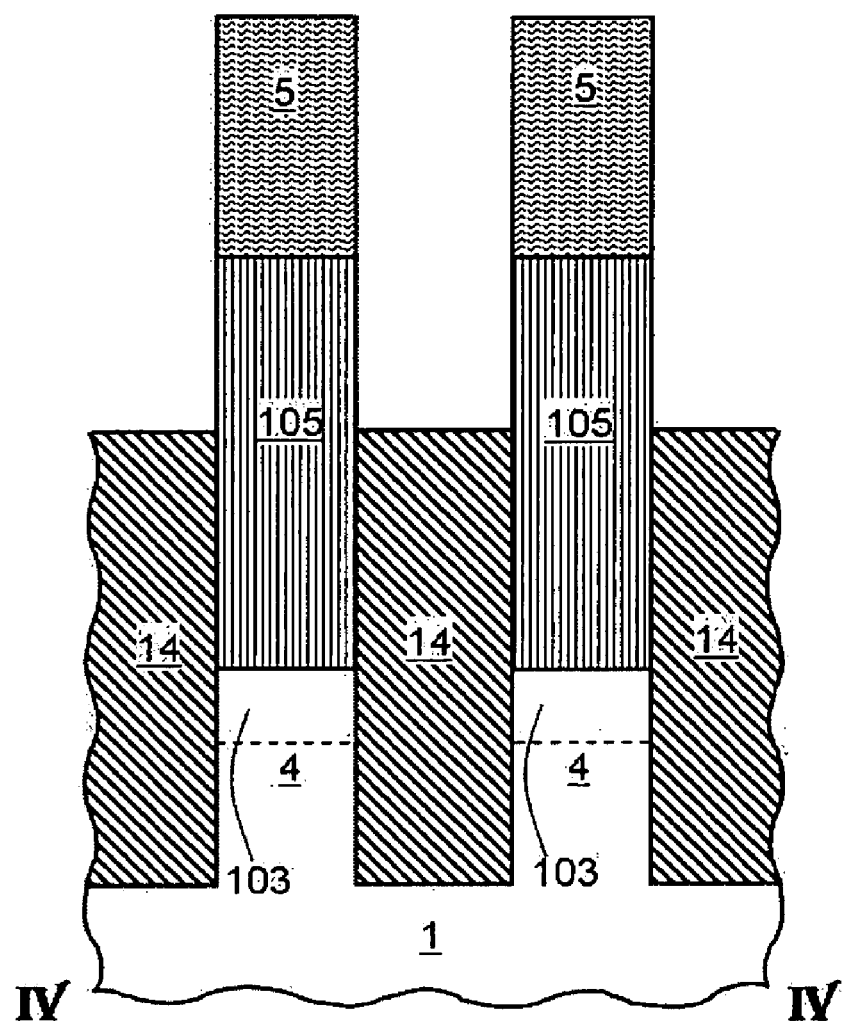

FIG. 20a to 20c illustrate a later process after the bit-line is formed.

A cross-sectional view along active area between III-III is shown in FIG. 20a, wherein a thin dielectric 113, drain 102, bit-line contact 105, and bit-line 5 have been formed. After the drain is recessed with regard to FIG. 19, a thin dielectric can be formed on the side wall of the recessed drain by means of oxidation or deposition and then perform an anisotropic etch which removes the dielectric layer 113 from the bottom of the recessed drain. The bit-line contact 105 can be formed by first depositing a conducting layer which may be poly-silicon or a metal layer, then performing an isotropic etch for recessing the layer. This is similar to forming the source-line contact 104 as illustrated in FIG. 18a. Bit-line 5 is formed by depositing a conductor and patterning it with line mask as shown in FIG. 20b wherein a schematic plan view after bit-line patterning is depicted. FIG. 20c illustrates a cross-sectional view along the cut-line between IV-IV from FIG. 20b.

As can be seen in FIGS. 20b and 20c, bit-line 5 is perpendicular to word-line 2 and it is connected to the active area line 4 via the bit-line contact 105. The drain 102 can be doped by ion implantation or out-diffusion of bit-line contact 105.

What is claimed is:

1. A semiconductor memory device, comprising:
    a semiconductor substrate of a first conductivity type;
    first and second regions doped with a second conductivity type for a source and a drain formed on said semiconductor substrate;
    a channel region recessed into said semiconductor substrate and disposed between said first and second doped regions in said semiconductor substrate;
    a first gate dielectric layer disposed over said channel and extending over portion of said source and drain;
    an electrically conductive material floating gate as electrical storage node disposed over said first gate dielectric layer;
    a p-n junction diode disposed between said drain and said floating gate;
    electrically conductive materials as source-connection plug and drain-connection plug connecting source and drain to external electrical terminals a second gate dielectric layer disposed between said p-n junction diode and said drain-connection plug;
    a third gate dielectric layer disposed over said floating gate and extending over portion of said p-n junction diode; and
    a control gate disposed over said third dielectric layer;
    wherein a gated diode is formed by said p-n junction diode, said second gate dielectric, and said drain connection plug as the gate of said gated diode.

2. The semiconductor memory device of claim 1, wherein said source and drain are recessed into said semiconductor substrate and are in the range of 10-300 nm in depth.

3. The semiconductor memory device of claim 1, wherein said first, second, third gate dielectric layers are silicon dioxide, silicon nitride, silicon oxynitride, or high-k dielectrics and is in the range of 30-100 angstroms in thickness.

4. The semiconductor memory device of claim 1, wherein said recessed channel has a depth in the range of 50 nm to 400 nm and a width in the range of 20 nm to 500 nm.

5. The semiconductor memory device of claim 1, wherein said floating gate is poly-silicon, tungsten, titanium nitride, tantalum nitride, or metal alloy.

6. The semiconductor memory device of claim 1, wherein said substrate is bulk crystalline silicon or silicon on insulator.

7. The semiconductor memory device of claim 1, wherein the anode of said gated diode is connected to said floating gate and the cathode of said gated diode is connected to said drain.

8. The semiconductor memory device of claim 1, wherein the cathode of said gated diode is connected to said floating gate and the anode of said gated diode is connected to said drain.

9. The semiconductor memory device of claim 1, wherein the logic state of the memory device depends on the amount or type of charges stored in said floating gate which is electrically charged or discharged via said gated diode.

10. The semiconductor memory device of claim 1, wherein the first conductivity type is doped with p-type dopant and second conductivity type is doped with n-type dopant.

11. The semiconductor memory device of claim 1, wherein the first conductivity type is doped with n-type dopant and second conductivity type is doped with p-type dopant.

12. The semiconductor memory device of claim 1, wherein said control gate is disposed over a portion of said p-n junction diode.

13. The semiconductor memory device of claim 1, wherein said control gate is not disposed over said p-n junction diode.

14. A semiconductor memory array, comprising a plurality of the semiconductor memory devices of claim 1, a plurality of word-lines, a plurality of bit-lines, and a common source-line, wherein each combination of one of the plurality of word-lines and one of the plurality of bit-lines selects a single semiconductor memory device of claim 1, and said common source-line is coupled to the source of said semiconductor memory device, said one of the plurality of word-lines is coupled to the control gate of one of the plurality of said semiconductor memory devices; said one of the plurality of bit-lines is coupled to the drain of one of the plurality of said semiconductor memory devices.

15. A method of selecting one of a plurality of semiconductor memory devices of claim 1 for writing, wherein each semiconductor memory device has a source coupled to said common source-line, a drain coupled to one of the plurality of bit-lines, a control gate coupled to one of the plurality of word-lines, a floating gate for the storage of charges thereon, said floating gate being capacitively coupled to said drain and to said control gate, and a gated diode connecting said floating gate and said drain, and wherein said method comprises the steps of:

writing a first logic state into one of the plurality of memory devices by:

applying a first voltage to said common source-line, applying a second voltage to a first word-line and a third voltage to a first bit line associated with the first said memory device thereby causing a high electric field in said gated diode and charges in said floating gate of said memory device can be transferred to said drain of said storage device through said gated p-n junction diode by band-to-band tunneling and impact ionization;

writing a second logic state into one of the plurality of memory devices by:

applying a first voltage to said common source-line, applying a fourth voltage to a first word-line and a fifth voltage to a first bit-line associated with the first said memory device thereby said gated diode is forward biased and charges in said drain of said memory device are transferred to the said floating gate of said memory device through said gated p-n junction diode 16. The method of claim 15, wherein said first voltage is in a range of −1 to 1 V, said second voltage is a negative voltage in a range of −1 to −5V, said third voltage is a positive voltage in a range of 1 to 5V, said fourth voltage is a positive voltage in a range of 1.5 to 5V, and said fifth voltage is in a range of −1 to 1 V.

* * * * *